(12) United States Patent
Sahara et al.

(10) Patent No.: US 6,392,282 B1
(45) Date of Patent: May 21, 2002

(54) BICMOS-INTEGRATED PHOTODETECTING SEMICONDUCTOR DEVICE HAVING AN AVALANCHE PHOTODIODE

(75) Inventors: Masanori Sahara; Takashi Suzuki, both of Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 0 days.

(21) Appl. No.: 09/628,446

(22) Filed: Jul. 28, 2000

Related U.S. Application Data

(63) Continuation-in-part of application No. PCT/JP99/00397, filed on Jan. 29, 1999.

(30) Foreign Application Priority Data

Jan. 30, 1998 (JP) ............................................ 10-019302
Jan. 30, 1998 (JP) ............................................ 10-019311

(51) Int. Cl.[7] ............................................ H01L 31/107
(52) U.S. Cl. ........................ 257/438; 257/446; 257/186
(58) Field of Search ................................ 257/438, 186, 257/44.6

(56) References Cited

FOREIGN PATENT DOCUMENTS

| JP | 53-137688 | 12/1978 |
|---|---|---|
| JP | 2-142181 | 5/1990 |
| JP | 2-218160 | 8/1990 |
| JP | 4-146671 | 5/1992 |
| JP | 4-256376 | 9/1992 |
| JP | 4-304665 | 10/1992 |
| JP | 5-226627 | 9/1993 |
| JP | 7-226532 | 8/1995 |
| JP | 7-231076 | 8/1995 |
| JP | 9-275199 | 10/1997 |
| JP | 410-189928 A | * 7/1998 |

* cited by examiner

*Primary Examiner*—David Nelms
*Assistant Examiner*—Tu-Tu Ho
(74) *Attorney, Agent, or Firm*—Morgan, Lewis & Bockius LLP

(57) ABSTRACT

An APD is provided, said APD having an N-type first buried region (cathode) formed on a P-type substrate, and P-type first, second layer, and fourth semiconductor region (anode) formed thereon. A vertical type PNP transistor is provided, said vertical type PNP transistor having the N-type first buried region formed on the substrate, a P-type first buried region and a P-type second semiconductor layer (collector) formed on the P-type first semiconductor layer, and an N-type second semiconductor region (base) in the P-type second semiconductor layer. A vertical type NPN transistor is provided, said vertical type NPN transistor having an N-type second buried region and an N-type first semiconductor region (collector) in the substrate, and a P-type third semiconductor region (base) in the N-type first semiconductor region. An NMOS is provided in the surface of the P-type second semiconductor layer. A PMOS is provided in the surface of the N-type second semiconductor region.

6 Claims, 13 Drawing Sheets

US 6,392,282 B1

BICMOS-INTEGRATED PHOTODETECTING SEMICONDUCTOR DEVICE HAVING AN AVALANCHE PHOTODIODE

RELATED APPLICATION

This is a continuation-in-part application of application Ser. No. PCT/JP99/00397 filed on Jan. 29, 1999, now pending.

BACKGROUND OF THE INVENTION

1. Field of the Invention

The present invention relates to a BiCMOS-integrated photodetecting semiconductor device and an avalanche photodiode (referred as APD) applicable to such a semiconductor device; and, in particular, to a BiCMOS-integrated photodetecting semiconductor device comprising a vertical type PNP transistor (referred as vertical type PNP-Tr), a MOS transistor, and an APD having a high sensitivity over ultraviolet, visible, and near-infrared regions, and an avalanche photodiode applicable to such a semiconductor device.

2. Related Background Art

Conventionally, most of APDs have been formed as single devices. In order to process optical signals received by an APD, the APD has been used together with signal processing integrated circuits or assembled into the same package with a signal processing semiconductor device so as to be used as a hybrid integrated circuit (hybrid IC).

On the other hand, Japanese Patent Application Laid-Open No. 2-218160 proposes an example of forming CCDs or MOS transistors and an APD. In this example, active elements such as transistors and an APD are constructed monolithically in one image sensor.

SUMMARY OF THE INVENTION

In the case where an APD is formed monolithically, since the APD is used for higher speed applications in general, a signal processing circuit for the APD necessitates wide-band electronic elements allowing the high speed operation thereof. Candidates for such electronic elements can be high-speed NPN transistors (referred as NPN-Tr) and PNP transistors (referred as PNP-Tr). One of NPN transistors, a vertical structure NPN-Tr suitable for high-speed operation, can easily be formed. Since the PNP-Tr, however, takes a lateral structure that is parasitically formed in the process of making the NPN-Tr, the performance of the PNP-Tr shows low speed and narrow-band.

However, since the APD and the signal processing circuit are assembled into the same package to form a hybrid IC, the configuration of the assembled hybrid IC is complicated. In the hybrid IC, electronic noise is likely to occur due to induction, and parasitic capacitance increases. Furthermore, it is difficult to arrange an array of APDs together with signal processing circuits therefor.

Japanese Patent Application Laid-Open No. 2-218160 publication discloses an example that necessitates complicated manufacturing steps, such as selective epitaxial growth, to form an APD, whereby the performance of the APD may not be sufficient, and it may be difficult to manufacture the APD in good yield. Also, since the NPN transistor in this publication is a parasitic transistor, it has high parasitic resistance such as emitter resistance, collector resistance, and/or base resistance. As a consequence, the performance, such as the linearity and frequency characteristics, of the transistor is not always sufficient to process signals from the APD. In other words, for manufacturing a high-performance APD capable of detecting weak high-speed optical signals, there is severe restriction concerning one manufacturing condition under which the PN junction of the APD should be formed, whereby its characteristics depend on the structure of the APD. On the other hand, in an integrated circuit formed of electronic elements, such as bipolar transistors and MOS transistors, there. is restriction concerning another manufacturing condition for integrating these elements. Hence, it is difficult to form both of them on the same substrate while exhibiting their respective characteristics.

In forming a bipolar transistor, on the other hand, an epitaxial layer is grown on a substrate. Although an epitaxial layer used for the bipolar transistor is relatively thin, an epitaxial layer used for the APD is relatively thick in order to attain a high sensitivity extending to the near infrared region. It is also difficult to satisfy these demands from both the APD and the bipolar transistor at the same time.

If a vertical type PNP-Tr is available in addition to a vertical type NPN-Tr as an electronic element used in a signal processing circuit for the APD, this allows the design of a complementary circuit capable of its high-speed operation. For constructing the vertical NPN-Tr, it is preferable to use a P-type substrate. The vertical PNP-Tr must be, therefore, constructed on the same P-type substrate. However, the collector of the vertical PNP-Tr cannot be isolated from the substrate in the P-type substrate, whereby the collector is always grounded. Consequently, the PNP-Tr suitable for the signal processing circuit cannot be obtained.

It is an object of the present invention to provide a BiCMOS-integrated photodetecting semiconductor device in which a vertical PNP-Tr and an APD can be constructed on the same P-type semiconductor substrate without decreasing their performance; and an APD applicable to this semiconductor device.

Therefore, the present invention is configured as follows:

The BiCMOS-integrated photodetecting semiconductor device in accordance with the present invention comprises: N-type first buried regions 3 formed in an upper surface portion of a P-type semiconductor substrate 1 in an avalanche photodiode forming area (referred as an APD forming area) and a vertical type PNP transistor forming area (referred as a vertical type PNP-Tr forming area); a P-type first semiconductor layer 5 formed on the P-type semiconductor substrate 1 and N-type first buried regions 3 in the APD forming area, the vertical type PNP-Tr forming area, P-channel MOS transistor forming area (referred as a PMOS-Tr forming area), an N-channel MOS transistor forming area (referred as an NMOS-Tr forming area), and a vertical type NPN transistor forming area (referred as vertical type NPN-Tr forming area); N-type second buried regions 7 formed in an upper surface portion of the P-type first semiconductor layer 5 in the PMOS forming area and NPN-Tr forming area; a P-type first buried region 9 formed in the upper surface portion of the P-type first semiconductor layer 5 on the N-type first buried region 3 in the vertical type PNP-Tr forming area; a P-type second buried region 11 formed, above the N-type first buried region 3 in the APD forming area, in the upper surface portion of the P-type first semiconductor layer 5; a P-type second semiconductor layer 13 formed on the P-type first semiconductor layer 5, P-type first buried region 9, P-type second buried region 11, and N-type second buried regions 7; an N-type first semiconductor region 15 formed in contact with the N-type second buried region 7 in the vertical type NPN-Tr forming area; an N-type second semiconductor region 17 formed in contact with the N-type second buried region 7 in the PMOS-Tr forming area; an N-type third semiconductor region 19 formed on the P-type first buried region 9 in the vertical type PNP-Tr forming area; an P-type third semiconductor region 27 formed in an upper surface portion of the N-type first semiconductor region 15 in the vertical type NPN-Tr forming area; a N-type fourth semiconductor region 25 formed in the upper surface portion of the P-type third semiconductor region 27 in the vertical type NPN-Tr forming area so as to surround a bottom surface and a side surface of the N-type fourth semiconductor region 25; and a P-type fourth semiconductor region 29 formed in an upper surface portion of the N-type third semiconductor region 19 in the vertical type PNP-Tr forming area; wherein the vertical type PNP-Tr is constituted such that the P-type first buried region 9, P-type first semiconductor layer 5, and P-type second semiconductor layer 13 in the vertical type PNP-Tr forming area form a collector thereof, the N-type third semiconductor region 19 forms a base thereof, and the P-type fourth semiconductor region 29 forms an emitter thereof; wherein the vertical type NPN-Tr is constituted such that the N-type second buried region 7 and N-type first semiconductor region 15 in the vertical type NPN-Tr forming area form a collector thereof, the P-type third semiconductor region 27 forms a base thereof, and the N-type fourth semiconductor region 25 forms an emitter thereof; wherein the APD is constituted such that the P-type first semiconductor layer 5 and P-type second semiconductor layer 13 in the APD forming area form an anode, and the N-type first buried region 3 in the APD forming area forms a cathode; wherein the collector of the vertical type PNP-Tr is isolated by the N-type second buried region 7 and an N-type fifth semiconductor area 41, the N-type second buried region 7 being formed, in contact with the N-type first buried region 3 in the vertical type PNP-Tr forming area, so as to surround the P-type first buried region 9, and an N-type fifth semiconductor area 41 being formed in contact with the N-type second buried region 7; and wherein the anode of the APD is isolated by the N-type second buried region 7 and an N-type sixth semiconductor area 42, the N-type second buried region 7 being formed, in contact with the N-type first buried region 3 in the APD forming area, so as to surround the P-type second buried region 11, and an N-type sixth semiconductor area 42 being formed in contact with the N-type second buried region 7 in the APD forming area.

Since the P-type semiconductor layer 5 and the P-type semiconductor layer 13 are thus provided on the N-type first buried region 3 so as to form the anode of an APD, the performance of the APD can be improved according to the total thickness of these P-type layers. Since the P-type first buried region 9 and the N-type second buried region 7 of the vertical type PNP-Tr forming area are formed in the P-type first semiconductor layer 5, the respective performance of the vertical type NPN-Tr and vertical type PNP-Tr can be tuned by adjusting the thickness of the P-type second semiconductor layer 13. Namely, if the thickness of the P-type first semiconductor layer 5 is adjusted, the sensitivity and response characteristics of the APD in a longer wavelength region can be improved without affecting the performance of the bipolar transistor.

In the APD forming area, since the N-type first buried region 3 is formed on the P-type substrate 1, this formation allows the isolation of the cathode from other regions. A separation area is constituted by the N-type second buried region 7 and the N-type sixth semiconductor area 42, the N-type second buried region 7 being formed so as to surround the P-type second buried region 11, and the N-type sixth semiconductor area 42 being formed in contact with the N-type second buried region 7. This separation area is disposed in contact with the N-type first buried region 3, so that: this structure can isolate the P-type first semiconductor layer 5 and the P-type second semiconductor layer 13 from the P-type substrate to isolate the anode. Since the anode and the cathode are separated as such, the APD can be an isolated element. Further, since the P-type second buried region 11 is provided in the upper surface portion on the P-type first semiconductor layer 5, it becomes easier to adjust characteristics of the APD. In other words, the avalanche breakdown voltage can be tuned according to the impurity profile of the P-type second buried region 11.

In the vertical type PNP-Tr forming area, since the P-type first buried region 9 is formed on the N-type first buried region 3, the collector can be separated from the P-type substrate 1. The above-mentioned separation area is disposed in contact with the N-type first buried region 3 from thereon. This separation area can isolate inner P-type area from other P-type semiconductor region of other area, whereby the isolated collector can be obtained. Since the P-type first buried region 9 is formed on the P-type first semiconductor layer 5, the collector resistance can be lowered. Furthermore, since the N-type third semiconductor region 19 and the P-type fourth semiconductor region 29 form the base and the emitter, respectively, the forming of a base profile and an emitter junction can be controlled separately from other elements. Namely, higher performances can be attained in the current amplification factor, Early voltage, frequency characteristics, and the like of the vertical type PNP-Tr.

In the vertical type NPN-Tr forming area, since the N-type second buried region 7 is formed on the P-type first semiconductor layer 5, the collector of the vertical type NPN-Tr with a low resistance can be formed, and the collector can be isolated from the P-type substrate 1. Also, since the P-type third semiconductor region 27 and the N-type fourth semiconductor region 25 form the base and the emitter, respectively, the formation of a base profile and an emitter junction can be controlled separately from other electronic elements on the substrate. This structure results in the higher performances of the vertical type NPN-Tr in the current amplification factor, Early voltage, frequency characteristics, and the like.

Since the NMOS-Tr forming area is disposed in the surface portion of the P-type second semiconductor layer 13, the manufacturing step can be simplified.

Also, since the PMOS-Tr forming area is disposed in the surface portion of the N-type second semiconductor region 17 on the N-type second buried region 7, this structure can lower the $h_{fe}$ of a parasitic PNP transistor with the base consisting of these N-type regions. As a consequence, the latch-up immunity can be improved.

Since the separation area is constituted by the N-type second buried region 7, the N-type fifth semiconductor area 41 and N-type sixth semiconductor area 42 formed on the region 7, the elements can be isolated with a small separation width. As a result, the P-type first semiconductor layer 5 in the NMOS-Tr forming area can be separated from other forming areas above.

In the BiCMOS-integrated photodetecting semiconductor device in accordance with the present invention, the N-type third semiconductor region 19 acting as the base of the vertical type PNP-Tr may be provided in the same process step as the N-type second semiconductor region 17.

When the N-type third semiconductor region 19 and the N-type second semiconductor region 17 are thus formed in the same process, the base of the vertical type PNP-Tr and the substrate-biased N-type region of the PMOS-Tr can be formed in the same process step, whereby the manufacturing step can be simplified.

The BiCMOS-integrated photodetecting semiconductor device in accordance with the present invention may have a light-shielding film 37 on the vertical type PNP-Tr, vertical type NPN-Tr, NMOS-Tr, and PMOS-Tr, while having an opening in the light-shielding film 37 disposed on the anode of the avalanche photodiode.

If the light-shielding film 37 is disposed on the vertical type PNP-Tr, vertical type NPN-Tr, NMOS-Tr, and PMOS-Tr as such, then these elements can operate stably regardless of light intensity. Also, if the opening portion of the light-shielding film 37 is disposed on the anode, then light can be introduced to the anode area.

In the BiCMOS-integrated photodetecting semiconductor device in accordance with the present invention, the N-type fifth semiconductor area 41 and the N-type sixth semiconductor area 42 may be formed in the same process step as that for at least one of the N-type first semiconductor region 15 and the N-type second semiconductor region 17.

If the N-type fifth semiconductor area 41 and the N-type sixth semiconductor area 42 are formed in the same step as that for at least one of the N-type first semiconductor region 15 and the N-type second semiconductor region 17 as such, then the manufacturing step can be simplified.

In the BiCMOS-integrated photodetecting semiconductor device in accordance with the present invention, the avalanche photodiode may have a P-type fourth semiconductor region formed on the anode, whereas the P-type fourth semiconductor region may include a plurality of semiconductor portions isolated from each other. Each individual P-type semiconductor portion is electrically separated from each other when a voltage is applied to the avalanche photodiode. Hence, the avalanche photodiode can operate as an avalanche photodiode having a plurality of anodes.

In the BiCMOS-integrated photodetecting semiconductor device in accordance with the present invention, the plurality of P-type semiconductor portions can be arranged in an array.

If the plurality of P-type semiconductor portions are arrayed, then it is possible to obtain information on which P-type semiconductor portion in the array detects light.

On the other hand, the APD applicable to the BiCMOS-integrated photodetecting semiconductor device as mentioned above can have configuration as follows.

The APD comprises a first P-type region; a second P-type region, formed around the first P-type region, having an impurity concentration lower than that in the first P-type region; and an N-type region formed around the second P-type region; wherein the first P-type region comprises a plurality of P-type portions.

In the APD comprising this configuration, the second P-type region is depleted when a high voltage is applied thereto, whereby the separated portions of the first P-type region are electrically isolated from each other. Therefore, there is no need to increase the distance between the P-type portions constituting the first P-type region, to provide the outer periphery of the first P-type region with a guard ring, or to provide separating means such as a layer for avoiding inversion.

Also, if the APD has the configuration as mentioned above, then the second P-type region is depleted when a high voltage is applied thereto, whereby electric field caused by the applied voltage is prevented from concentrating on the edges of the first P-type region.

The APD of the present invention may be formed such that the first P-type region has two separated P-type portions.

Also, the APD of the present invention may be formed such that the first P-type region has four separated P-type portions.

Furthermore, in the APD of the present invention, the N-type region may be formed on the P-type substrate.

If the N-type region is formed on the P-type substrate as in the configuration mentioned above, then a plurality of N-type areas electrically separated from each other can be formed on the same P-type substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8A is a plan view of an APD having another structure, whereas

FIG. 12A is a plan view of a two-divided type APD, whereas FIG. 13A is a plan view showing the configuration of a conventional APD, whereas

DESCRIPTION OF THE PREFERRED EMBODIMENTS

Figure 1A:
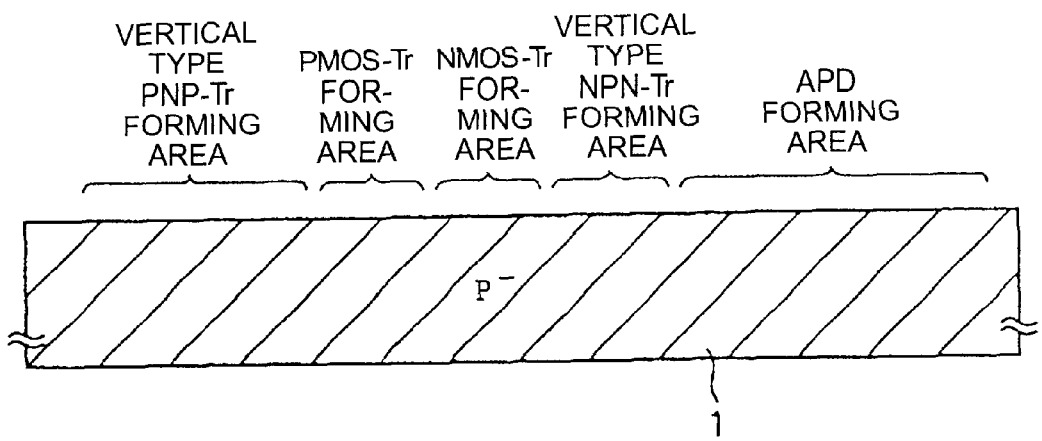
FIGS. 1A to 1C are sectional views in respective steps for explaining a method of making a BiCMOS-integrated photodetecting semiconductor device.

In the following, the present invention will be explained with reference to the accompanying drawings.

Parts identical to each other will be referred to with reference numerals identical to each other without repeating their explanations.

FIGS. 1A to 1C, 2A to 2C, 3A to 3C, and 4A and 4B are sectional views in respective manufacturing steps of a BiCMOS-integrated photodetecting semiconductor device in accordance with the present invention. With reference to these drawings, the process of manufacturing the BiCMOS-integrated photodetecting semiconductor device will be explained.

A P-type Silicon substrate 1 is employed as a semiconductor substrate (see FIG. 1A). The substrate 1 preferably has an impurity concentration of at least $1 \times 10^{14}$ cm$^{-3}$ but not greater than $2 \times 10^{15}$ cm$^{-3}$ and preferably employs (100) as its surface orientation.

Figure 1B:
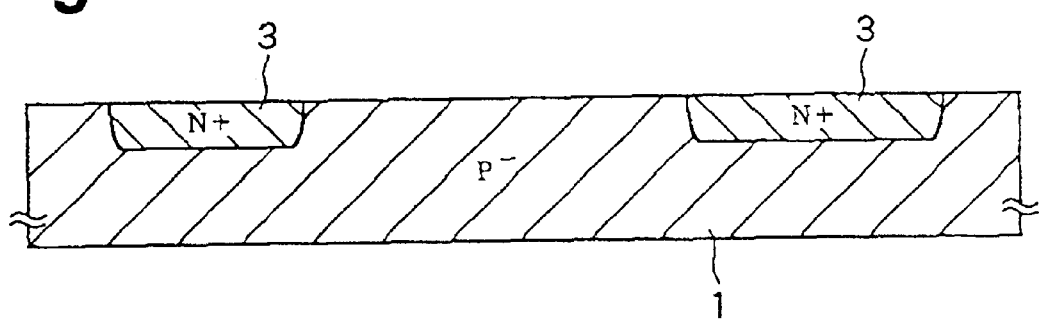

N-type first buried regions 3 is formed in an upper surface portion of the substrate 1 (see FIG. 1B). For forming the N-type first buried regions 3, a silicon oxide film is formed on the substrate 1 and predetermined portions of this oxide film is eliminated by photolithography technique and etching to form a diffusion mask comprising the remaining silicon oxide film. Then, N-type impurity is introduced in thermal diffusion method. As the impurity, antimony (Sb) or arsenic (As) is preferable.

As shown in FIG. 1B, the N-type first buried regions 3 are formed in an APD forming area and a vertical type PNP-Tr forming area. When provided in the APD forming area to form a junction between the N-type first buried region 3 and the P substrate 1, it becomes a cathode. For lowering the resistance of the cathode of the APD, the depth of the junction is preferably on the factor of 4 μm to 6 μm, whereas the surface concentration of the N-type first buried region 3 is preferably at least $1 \times 10^{19}$ cm$^{-3}$ but not greater than $5 \times 10^{19}$ cm$^{-3}$. The N-type first buried region 3 in the APD forming area can electrically separate the cathode from the substrate 1. The N-type buried region in the vertical type PNP-Tr forming area can electrically separate its collector from the substrate 1.

Figure 1C:
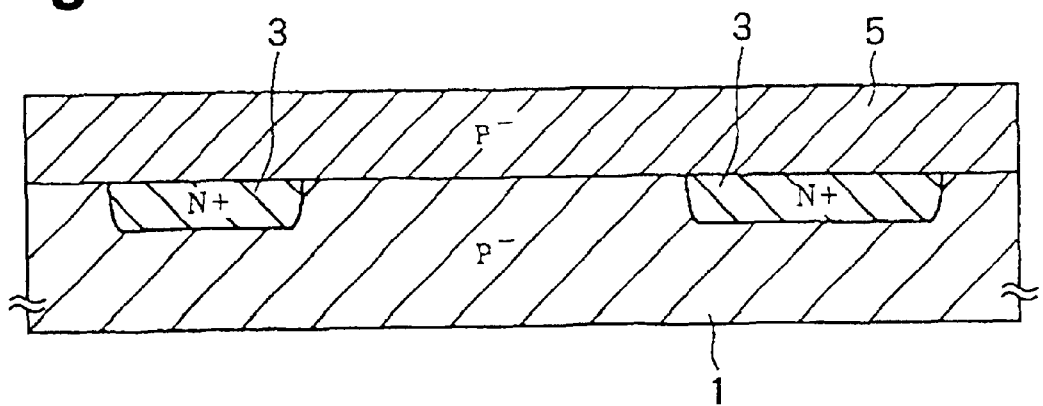

Subsequently, a P-type first semiconductor layer 5 is formed on the whole wafer surface (see FIG. 1C). The layer 5 may be formed in a vertical type NPN-Tr forming area, an NMOS-Tr forming area, a PMOS-Tr forming area, the vertical type PNP-Tr forming area, and the APD forming area. For forming a relatively thick semiconductor layer with a uniform concentration, the P-type first semiconductor layer 5 is formed in an epitaxial growth method. The thickness of the P-type semiconductor layer 5 is determined according to the depletion layer width, operating voltage, incident light wavelength, and spectral sensitivity of the APD. The thickness can be adjusted within the respective thickness of the N-type first buried layer 3 and an N-type second buried region 7, which will be connected with each other. The layer 5 preferably has its resistivity and its impurity concentration on the same order as those of the substrate 1. In particular, the impurity concentration may be within the range of at least $1 \times 10^{14}$ cm$^{-3}$ but not greater than $1 \times 10^{15}$ cm$^{-3}$.

Figure 2A:
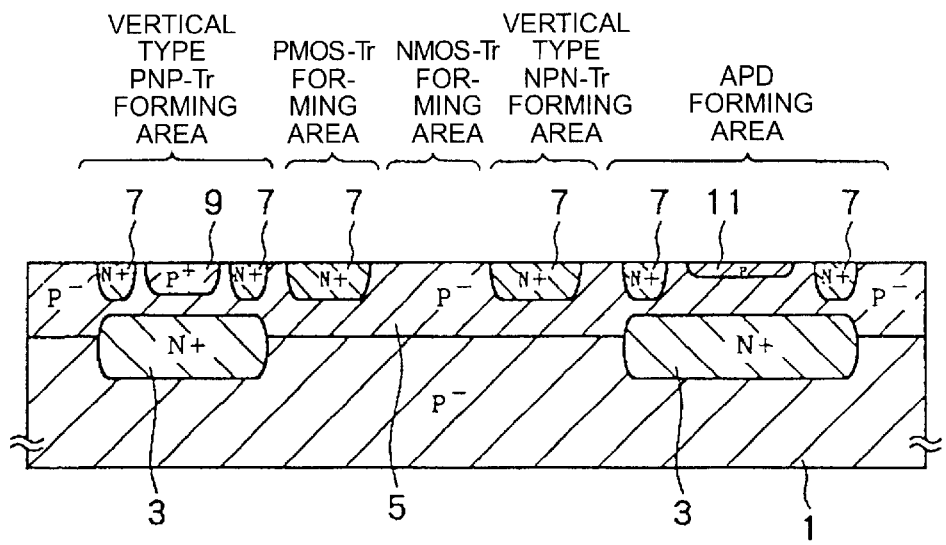
FIGS. 2A to 2C are sectional views in respective steps for explaining the method of making a BiCMOS-integrated photodetecting semiconductor device.

Thereafter, N-type second buried regions 7 are formed in a surface portion of the P-type first semiconductor layer 5 (see FIG. 2A). The N-type second buried regions 7 can be provided in the same method as the N-type first buried regions 3 using photolithography and diffusion technique to form a junction between the N-type second buried regions 7 and the P-type first semiconductor layer 5. As the impurity to be introduced, antimony (Sb) or arsenic (As) is preferable. For lowering the collector resistance, the depth of the junction is preferably on the order of 4 μm to 6 μm, whereas the surface concentration of the regions 7 is preferably at least $1 \times 10^{19}$ cm$^{-3}$ but not greater than $5 \times 10^{19}$ cm$^{-3}$. In FIG. 2A, the N-type first buried regions 3 is shown as expanding into the P-type first semiconductor layer 5 because, in the following step of forming the N-type second buried regions 7, the impurity in the N-type first buried regions 3 diffuses into the P-type first semiconductor layer 5 to form the N-type region in the P-type first semiconductor layer 5. Similar description will, however, be omitted in the following for simplicity.

As shown in FIG. 2A, N-type second buried regions 7 are formed in the vertical type NPN-Tr forming area, PMOS-Tr forming area, vertical type PNP-Tr forming area, and APD forming area. The N-type second buried regions 7 serve as the collector of the vertical type NPN-Tr when formed in the vertical type NPN-Tr forming area, and a substrate biased portion (referred as B portion of FIG. 4B) when formed in the PMOS-Tr forming area, respectively. Since the collector and the substrate-biased portion are thus formed in the surface portion of the P-type first semiconductor layer 5, the vertical type NPN-Tr and PMOS-Tr can be constructed as if P-type first semiconductor layer 5 were a substrate. On the other hand, in the APD forming area and the vertical type PNP-Tr forming area, the N-type second buried regions 7 is formed on the N-type first buried region 3 so as to a separation area. When the separation area is formed as such, the N-type second buried regions 7 connect with the N-type first buried regions 3 to be electrically connected to the N-type first buried regions 3. The separation area is formed in a band-like region closed along the outer periphery of the N-type first buried regions 3. More specifically, in the vertical type PNP-Tr forming area, the region 7 is formed as a collector separation area surrounding a P-type first buried region 9, which will be formed later. In the APD forming area, it is formed as a cathode separation area surrounding a P-type second buried region 11, which will be formed later.

Subsequently, the P-type first buried region 9 is formed in the vertical type PNP-Tr forming area (see FIG. 2A). It is preferred that the P-type first buried region 9 be formed by photolithography technique and ion implantation and that the impurity for the ion implantation be boron (B$^+$). The P-type first buried region 9 is formed, on the N-type first buried region 3, so as to be surrounded by the previously formed N-type second buried region 7. For lowering the collector resistance, the dose of the ion implantation is preferably at least $5 \times 10^{13}$ cm$^{-2}$ but not greater than $3 \times 10^{15}$ cm$^{-2}$.

Then, a P-type second buried region 11 is formed in the APD forming area (see FIG. 2A). It is preferred that the P-type second buried region 11 be formed by use of photolithography technique and ion implantation and that the impurity of the ion implantation be boron (B$^+$). The P-type second buried region 11 is formed, above the N-type first buried region 3, so as to be surrounded by the previously formed N-type second buried region 7. For improving the performance of the APD, the dose of the ion implantation is preferably at least $3 \times 10^{11}$ cm$^{-2}$ but not greater than $3 \times 10^{13}$ cm$^{-2}$. According to the impurity concentration and the depth of this region 11, the performance of the APD can be adjusted. Namely, since the P-type second buried region 11 is disposed, on the N-type first buried region 3, in the surface portion of the P-type first semiconductor layer 5, the impurity profile of the P-type second buried region 11 can control the width of the depletion layer spreading from the N-type first buried region 3. Therefore, the avalanche breakdown voltage of the APD can be adjusted.

The P-type first buried region 9 and the P-type second buried region 11 may be formed before the formation of the N-type second buried regions 7.

Figure 2B:
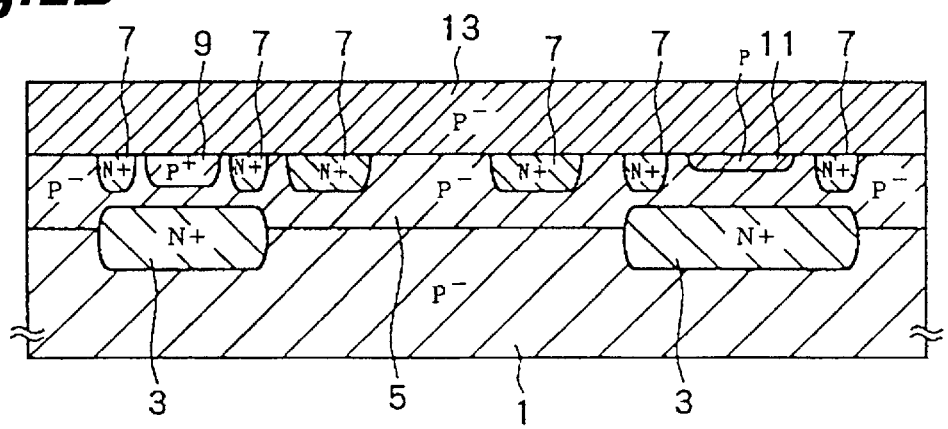

After these impurity layers are formed, a P-type second semiconductor layer 13 is formed on the surface thereof (see FIG. 2B). This layer 13 may be formed in the vertical type NPN-Tr forming area, NMOS-Tr forming area, PMOS-Tr forming area, vertical type PNP-Tr forming area, and APD forming area. For forming a relatively thick semiconductor layer with a uniform concentration, the P-type second semiconductor layer 13 is formed in epitaxial growth method. For fully exhibiting the performance of a bipolar transistor, the thickness of the epitaxial layer is preferably on the order of 5 µm to 10 µm, and its impurity concentration is preferably on the same order as that in the substrate 1. In the NMOS-Tr forming area, the P-type second semiconductor layer 13 and the first semiconductor layer 5 work as a substrate biased portion (referred as C portion in FIG. 4B) for the NMOS-Tr. In the APD forming area, since the P-type first semiconductor layer 5 and the P-type second semiconductor layer 13 act as light-absorbing portions, the thickness of these two layers determines the sensitivity in the longer limit of wavelength. Therefore, if the P-type first semiconductor layer 5 is made thicker so as to increase the total thickness of the light-absorbing portions, then the sensitivity of the APD in the longer wavelength region can be enhanced without affecting the characteristics of the bipolar transistor.

Subsequently, an N-type first semiconductor region 15 is formed by using photolithography technique and etching (see FIG. 2C). Since the N-type first semiconductor region 15 is relatively deep and with a low concentration, it is preferred that the region be formed by ion implantation, and that phosphorus ($P^+$) be employed as the impurity. For fully exhibiting characteristics of the vertical type NPN-Tr, the dose of the ion implantation is preferably at least $3 \times 10^{12}$ $cm^{-2}$ but not greater than $6 \times 10^{12}$ $cm^{-2}$.

Figure 2C:
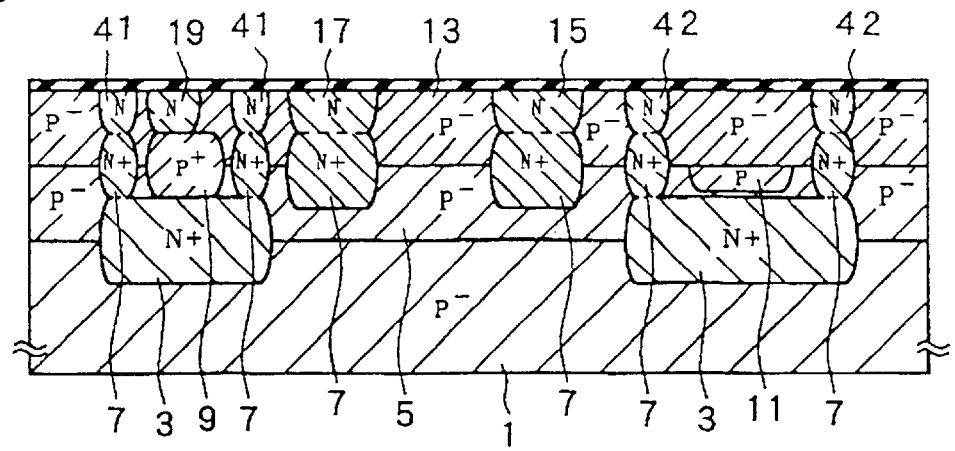

As shown in FIG. 2C, the N-type first semiconductor region 15 may be formed by the same process as that used for an N-type sixth semiconductor area 42 in the APD forming area.

In the vertical type NPN-Tr forming area, it is particularly preferred that the N-type first semiconductor region 15 be formed on the N-type second buried region 7 in a shape substantially identical to the N-type second buried region 7. This results in the collector with a low resistance because the N-type first semiconductor region 15 connects with the N-type second buried region 7 due to the diffusion of the impurity in these regions such that they contact electrically with each other.

In the APD forming area, the N-type sixth semiconductor area 42 is formed in the anode separation area. This separation area is formed, on the N-type second buried region 7, in a band-like closed region surrounding the anode. When formed as such, the N-type sixth semiconductor area 42 connects with the N-type second buried region 7 due to the diffusion of the impurity so as to electrically connect with each other. Furthermore, since the separation area should be small to obtain the isolation of the anode, the N-type sixth semiconductor area 42 preferably has an area substantially identical to that of the N-type second buried region 7.

Subsequently, an N-type second semiconductor layer 17 is formed in the same process as that used for the N-type first semiconductor region 15 (see FIG. 2C). For fully exhibiting characteristics of the PMOS-Tr, the dose of the ion implantation is preferably at least $6 \times 10^{12}$ $cm^{-2}$ but not greater than $8 \times 10^{12}$ $cm^{-2}$.

As shown in FIG. 2C, the N-type second semiconductor region 17 may be formed in the same process as that used for the N-type third semiconductor region 19 and N-type fifth semiconductor area 41 in the vertical type PNP-Tr forming area.

In the PMOS-Tr forming area, the N-type second semiconductor region 17 is formed on the N-type second buried region 7, preferably, in an area substantially identical to the N-type second buried region 7. The N-type second semiconductor region 17 connects with the N-type second buried region 7 due to the diffusion of the impurity in the subsequent manufacturing steps, thereby forming a substrate-biased portion. Since the N-type base in a parasitic transistor has a high impurity concentration and a thick layer, this suppresses the operations of the parasitic transistor, thereby improving the resistance to latch-up phenomenon. Since the P-type first semiconductor layer 5 and the P-type second semiconductor layer 13 surround the sides and bottom of the N-type second semiconductor region 17 and the N-type second buried region 7, these regions 7 and 17 are electrically separated from the substrate 1, the collector of the vertical type NPN-Tr, and the PMOS-Tr substrate biased portions.

In the vertical type PNP-Tr forming area, the N-type fifth semiconductor area 41 is formed in a collector separation area. This separation area is formed, in contact with the N-type second buried region 7, so as to surround the collector in a closed band shape. When formed as such, the N-type fifth semiconductor area 41 can connect with the N-type second buried region 7 due to the impurity diffusion from these layers in the subsequent steps, so that the layers electrically connect with each other. Preferably, the area 41 is disposed on an area substantially identical to the N-type second buried region 7, whereby the collector can be separated by a small area. The N-type third semiconductor region 19 is formed, on the P-type first buried region 9 in the surface of the P-type second semiconductor layer 13, so as to form the base of the vertical type PNP-Tr.

It is preferred that the thickness of the N-type regions 15, 17 be set to 2 µm to 4 µm through a high-temperature heating step after the ion implantation for the N-type first semiconductor region 15 and the N-type second semiconductor region 17.

Figure 3A:
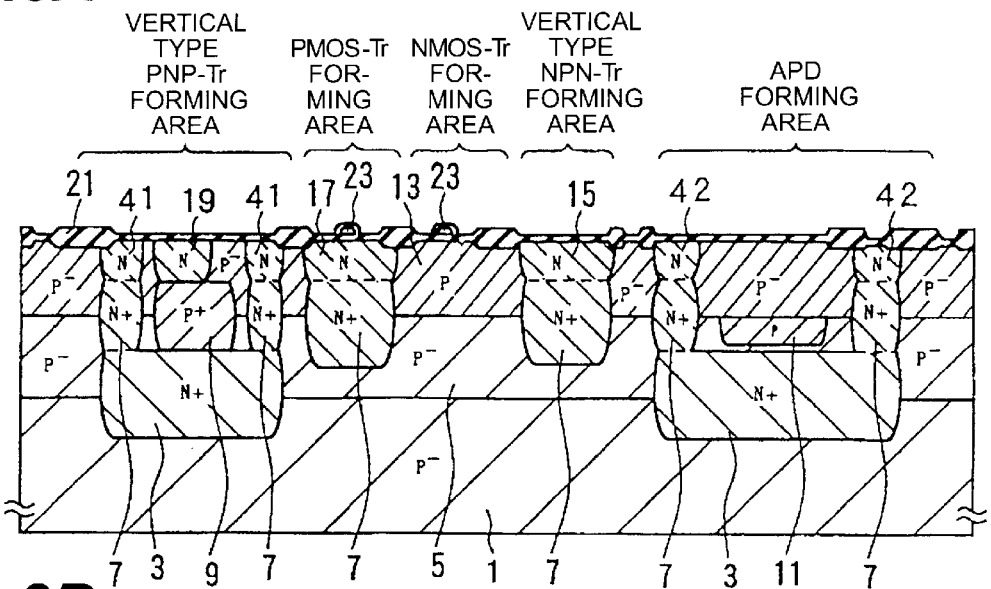
FIGS. 3A to 3C are sectional views in respective steps for explaining the method of making a BiCMOS-integrated photodetecting semiconductor device.

Subsequently, a LOCOS 21 is formed (see FIG. 3A). For example, the LOCOS 21 is formed in the following method. An Silicon nitride film is deposited on an Silicon oxide film on the wafer surface. The Silicon nitride film in the area other than the transistor regions is eliminated by photolithography technique and etching. Then, the oxidization of the wafer in an oxidizing furnace produces a thicker oxide film except for areas disposed in Silicon nitride film, thus forming a field oxide film 21 in the area other than transistor regions. The field oxide film 21 is formed in the transistor regions within the vertical type PNP-Tr forming area, vertical type NPN-Tr forming area, PMOS-Tr forming area, NMOS-Tr forming area, and APD forming area. When formed as such, the field oxide film 21 can separate the areas of APD, NMOS-Tr, PMOS-Tr, vertical type PNP-Tr, and vertical type NPN-Tr formed in the transistor regions.

Thereafter, impurity element for the PMOS-Tr and NMOS-Tr is introduced to the respective channel areas thereof in ion implantation method, so that the respective gate surface areas of the PMOS-Tr and NMOS-Tr have appropriate impurity concentrations. These ion implantation steps determine the respective threshold voltages of the PMOS-Tr and NMOS-Tr. Then, a gate oxide film is formed in the channel portions.

Subsequently, a polysilicon film is deposited on the wafer in CVD method. After phosphorus diffusion to the a polysilicon film for lowering the resistance thereof, photolithography technique is used for patterning. Then, the unnecessary polysilicon portion is etched and gate electrodes 23 of NMOS-Tr and PMOS-Tr, and their wires remain (see FIG. 3A).

Figure 3B:
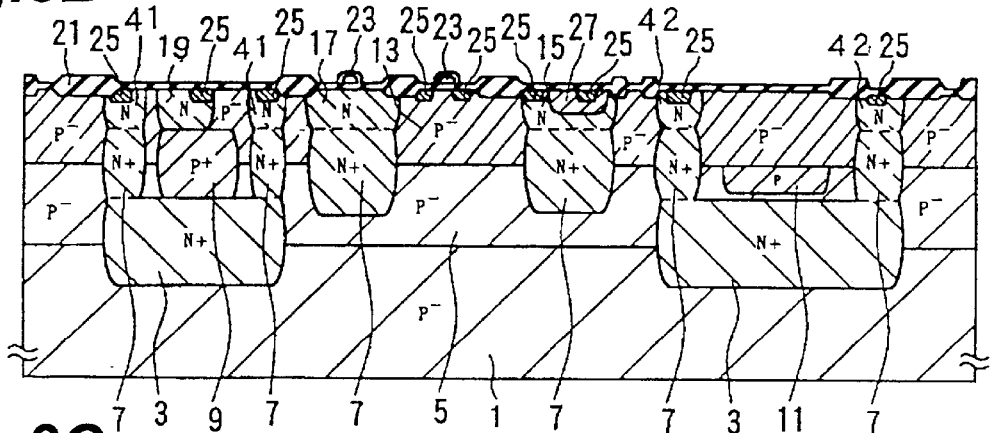

Then, a P-type third semiconductor layer 27 is formed as a base in the vertical type NPN-Tr forming area (see FIG. 3B). The P-type third semiconductor region 27 is formed in the surface portion in the N-type first semiconductor region 15 such that this semiconductor layer 15 surrounds the side surfaces and bottom surface of the P-type third semiconductor region 27. The P-type third semiconductor region 27 is formed in photolithography technique method and ion implantation method. In the ion implantation, P-type impurity is accelerated in a low energy, while $B^{30}$ is used as the impurity to be ion-implanted. For fully exhibiting characteristics of the vertical type NPN-Tr, the dose of the ion implantation is preferably at least $5\times10^{13}$ cm$^2$ but not greater than $3\times10^{14}$ cm$^{-2}$. After thermal activation for the impurity, the depth of the junction between the P-type third semiconductor region 27 and the N-type first semiconductor region 15 is preferably on the order of 0.5 μm to 0.7 μm so that the vertical type NPN-Tr can attain higher speed operation.

Subsequently, N-type fourth semiconductor regions 25 are formed in the transistor regions (see FIG. 3B). For forming the N-type fourth semiconductor regions 25 doped heavily with a shallow junction, it is preferred that arsenic (As$^{30}$) be employed as an impurity. For fully exhibiting characteristics of the emitters of the NMOS-Tr and NPN-Tr, the dose of the ion implantation is preferably at least $3\times10^{15}$ cm$^{-2}$ but not greater than $10\times10^{15}$ cm$^{-2}$. After activation for the ion-implanted impurity, the depth of the junction is preferably 0.2 μm to 0.4 μm.

The N-type fourth semiconductor regions 25 are formed in the vertical type PNP-Tr forming area, vertical type NPN-Tr forming area, APD forming area, and NMOS-Tr forming area. More specifically, the N-type fourth semiconductor regions 25 are formed in the upper surface layer of the N-type second semiconductor region 19 to provide an electrode of a base in the vertical type PNP-Tr forming area. In the vertical type NPN-Tr forming area, the region 25 is formed in the surface portion of the P-type third semiconductor region 27 to provided an emitter, and the region 25 is formed in the surface portion of the N-type first semiconductor region 15 to provide an electrode of a collector. In the APD forming area, the region 25 is formed in the upper surface layer of the N-type sixth semiconductor region 42 in the separation area to provide an electrode connected to the separation area. In the NMOS-Tr forming area, the regions 25 are formed adjacent to both sides of the gate electrode 23 to provide source and drain regions in the NMOS-Tr. Such a high-concentration diffusion layer is utilized for forming an ohmic contact between the N-type semiconductor layer and a metal electrode 33.

Figure 3C:
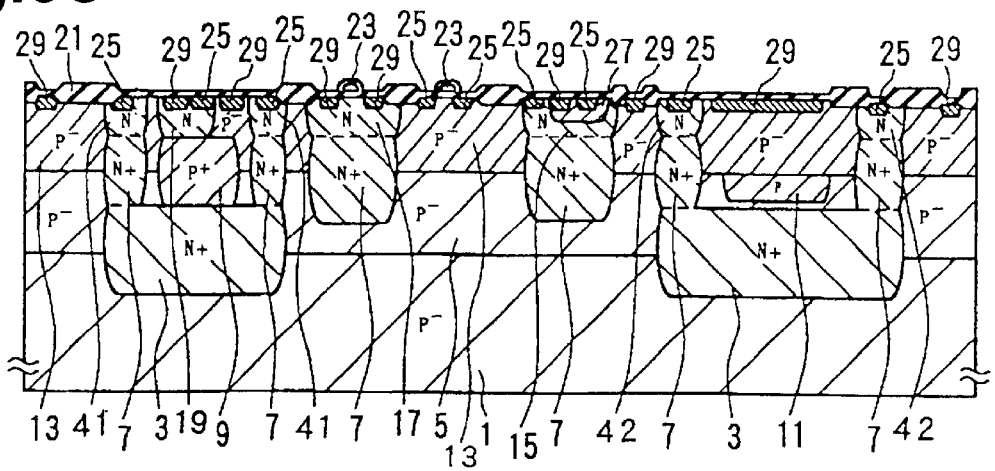

Subsequently, a P-type fourth semiconductor regions 29 are formed in the surface of the transistor regions in the APD forming area (see FIG. 3C). For forming the P-type fourth semiconductor regions 29 doped heavily with a shallow junction, it is preferred that ion implantation be used with $B^{30}$ being employed as P-type impurity. For fully exhibiting characteristics of the PMOS-Tr and the emitters of the PNP-Tr, the dose of the ion implantation is preferably at least $1\times10^{15}$ cm$^{-2}$ but not greater than $5\times10^{15}$ cm$^{-2}$. After activation step for the impurity, the depth of the junction therebetwenn is preferably 0.2 μm to 0.4 μm.

The P-type fourth semiconductor regions 29 are formed in the vertical type PNP-Tr forming area, APD forming area, vertical type NPN-Tr forming area, and PMOS-Tr forming area. More specifically, in the vertical type PNP-Tr forming area, the P-type fourth semiconductor region 29 is formed in the upper surface of the N-type third semiconductor region 19 to provide the emitter, and the P-type fourth semiconductor region 29 are formed in the upper surface layer of the P-type second semiconductor layer 13 to provide a contact of the collector electrode. In the APD forming area, the region 29 is formed on the P-type second semiconductor layer 13 in the anode separation area to provide a diffusion electrode of the anode. In the vertical type NPN-Tr forming area, the region 29 is formed in the upper surface of the third P-type diffusion region 27 to provide a contact of the base electrode. In the PMOS-Tr forming area, the regions 29 are formed adjacent to both sides of the gate electrode 8 to provide source and drain regions of the PMOS-Tr. Such a heavily doped diffusion layer is utilized for making ohmic contact between the P-type semiconductor region and the metal electrode 33.

Subsequently, a BPSG film 31 is grown over the whole surface in CVD technique method (see FIG. 4A). The BPSG film 31 is planarized in heat treatment step for reflowing the film.

Figure 4A:
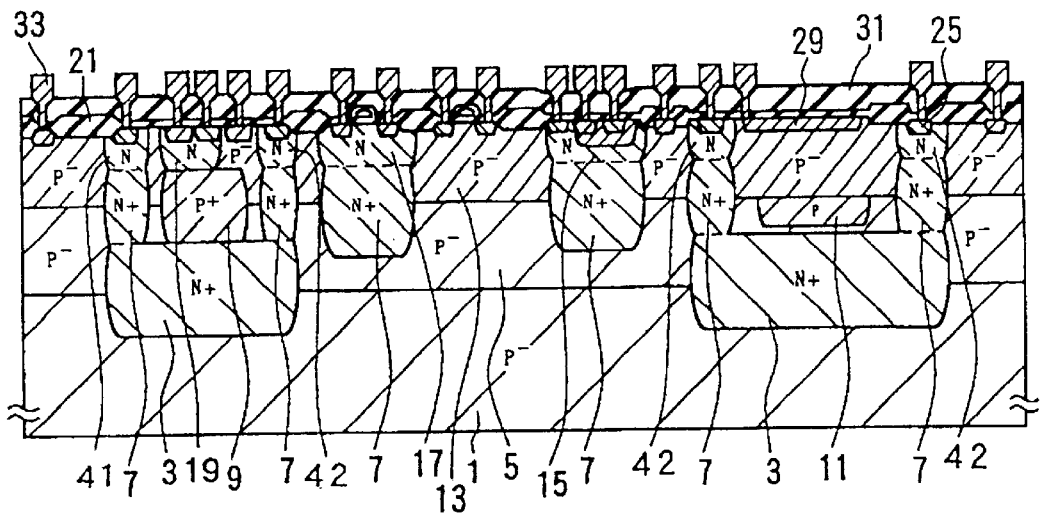
FIGS. 4A and 4B are sectional views in respective steps for explaining the method of making a BiCMOS-integrated photodetecting semiconductor device.

Then, for connecting the metal electrode 33 with regions 25, 29 and gate polysilicon 23, via holes are formed through the BPSG film 31 in anisotropic etching method (see FIG. 4A).

Thereafter, metal is deposited over the surface of the wafer, and is patterned and etched in photolithography technique method, so that the metal electrodes 33 are formed (see FIG. 4A). Using aluminum as the metal facilitates the processing of the metal. Depositing the metal in sputtering method provides the metal layer with favorable step coverage. Disposing the metal electrode 33 on the N-type region and P-type region results in an ohmic contact therebetween.

Subsequently, an interlayer insulating film 35 is formed over the surface of the wafer (see FIG. 4B). A silicon oxide film, a silicon nitride film, or a multilayer film thereof can be used as the interlayer insulating film 35. These films can be formed easily.

Figure 4B:
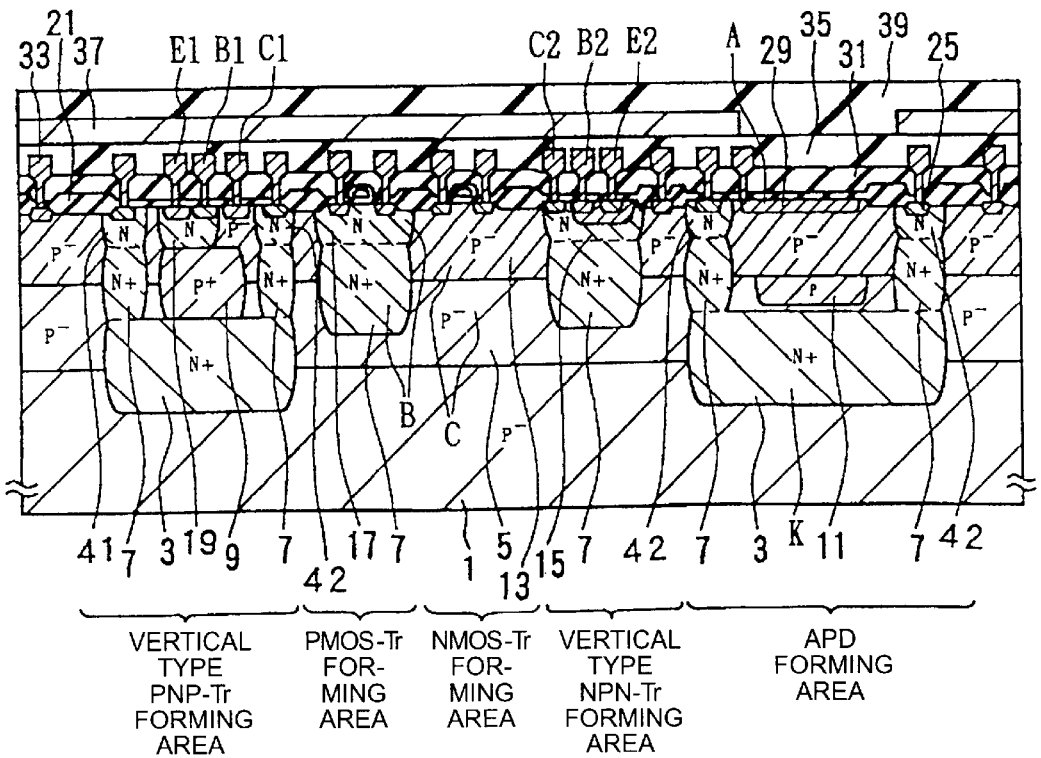

Then, a light-shielding film is deposited on the interlayer insulating film 35 (see FIG. 4B). The light-shielding film is eliminated in only the APD area by use of photolithography technique so as to prevent light from entering the region other than the anode of the APD. Metal is used preferably as the light-shielding film 37 due to its favorable light-shielding characteristic. In particular, using aluminum as the metal is preferable because it is easy to process an aluminum film. The light-shielding film 37 is two-dimensionally formed so as to cover the vertical type PNP-Tr, vertical type NPN-Tr, NMOS-Tr, and PMOS-Tr, whereas an opening portion of the light-shielding film 37 is disposed on the anode. If the light-shielding film 37 is a metal film such as aluminum, it can also be utilized as wires for connecting elements to each other.

Further, a passivation film 39 is deposited on the whole wafer surface (see FIG. 4B).

In the method as explained above, the BiCMOS-integrated photodetecting semiconductor device (FIG. 4B) can be manufactured. As shown in FIG. 4B, the BiCMOS-integrated photodetecting semiconductor device has the vertical type PNP-Tr forming area, PMOS-Tr forming area, NMOS-Tr forming area, vertical type NPN-Tr forming area, and APD forming area. These areas are successively arranged from the left to the right of the figure. The semiconductor device comprises: the N-type first buried regions 3 formed in the APD forming area and vertical type PNP-Tr forming area in the surface portion in the P-type semiconductor substrate 1; the P-type first semiconductor layer 5 formed on the P-type semiconductor substrate 1 and N-type first buried regions 3, in the APD forming area, vertical type PNP-Tr forming area, PMOS-Tr forming area, NMOS-Tr forming area, and vertical type NPN-Tr forming area; the N-type second buried regions 7 formed in the surface portion in the P-type first semiconductor layer 5 in the PMOS forming area and NPN-Tr forming area; the P-type first buried region 9 formed, in the surface portion of the P-type first semiconductor layer 5, on the N-type first buried region 3 in the vertical type PNP-Tr forming area; the P-type second buried region 11 formed, in the surface portion of the P-type first semiconductor layer 5, on the N-type first buried region 3 in the APD forming area; the P-type second semiconductor layer 13 formed on the P-type first semiconductor layer 5, P-type first buried region 9, P-type second buried region 11, and N-type second buried region 7; the N-type first semiconductor region 15 formed in contact with the N-type second buried region 7 in the vertical type NPN-Tr forming area; the N-type second semiconductor region 17 formed in contact with the N-type second buried region 7 in the PMOS-Tr forming area; the N-type third semiconductor region 19 formed on the P-type first buried region 9 in the vertical type PNP-Tr forming area; the P-type third semiconductor region 27 formed in the surface portion of the N-type first semiconductor region 15 in the vertical type NPN-Tr forming area; the N-type fourth semiconductor region 25 formed in the surface portion in the vertical type NPN-Tr forming area so as to surround the bottom and side surfaces of the N-type fourth semiconductor region 25; and the P-type fourth semiconductor region 29 formed in the surface portion of the N-type third semiconductor region 19 in the vertical type PNP-Tr forming area.

The vertical type PNP-Tr is constituted as follows: its collector is formed of the P-type first buried region 9, P-type first semiconductor layer 5, and P-type second semiconductor layer 13 in the vertical type PNP-Tr forming area; its base is formed of the N-type third semiconductor region 19; and its emitter is formed of the P-type fourth semiconduct or region 29. The vertical type NPN-Tr is constituted as follows; its collector is formed of the N-type second buried region 7 and N-type first semiconductor region 15 in the vertical type NPN-Tr forming area; its base is formed of the P-type third semiconductor region 27; and its emitter is formed of the N-type fourth semiconductor region 25. The APD is constituted as follows; its anode is formed of the P-type first semiconductor layer 5 and P-type second semiconductor layer 13 in the APD forming area; and its cathode is formed of the N-type first buried region 3 in the APD forming area.

It is, also, possible to manufacture the BicMos-integrated photodetecting semiconductor device (see FIG. 4B) in which the collector of the vertical type PNP-Tr is separated by the N-type second buried region 7 and the N-type fifth semiconductor area 41, the N-type second buried region 7 being formed in contact with the N-type first buried region 3 in the vertical type PNP-Tr forming area so as to surround the P-type first buried region 9, and the N-type fifth semiconductor area 41 being formed in contact with the N-type second buried region 7; whereas the anode of the APD is separated by the N-type second buried region 7 and the N-type sixth semiconductor area 42, the N-type second buried region 7 being formed in contact with the N-type first buried region 3 from thereon in the APD forming area so as to surround the P-type second buried region 11, and the N-type sixth semiconductor area 42 being formed in contact with the N-type second buried region 7.

Furthermore, it is possible to manufacture the BiCMOS-integrated photodetecting semiconductor device (see FIG. 4B) in which the collector of the vertical type PNP-Tr is separated by the N-type second buried region 7 and the N-type fifth semiconductor area 41, the N-type second buried region 7 being formed in contact with the N-type first buried region 3 in the vertical type PNP-Tr forming area so as to surround the P-type first buried region 9, the N-type fifth semiconductor area 41 being formed in contact with the N-type second buried region 7; and the anode of the APD is separated by the N-type second buried region 7 and the N-type sixth semiconductor area 42, the N-type second buried region 7 being formed in contact with the N-type first buried region 3 in the APD forming area so as to surround the P-type second buried region 11, and the N-type sixth semiconductor area 42 being formed in contact with the N-type second buried region 7.

Figure 5:
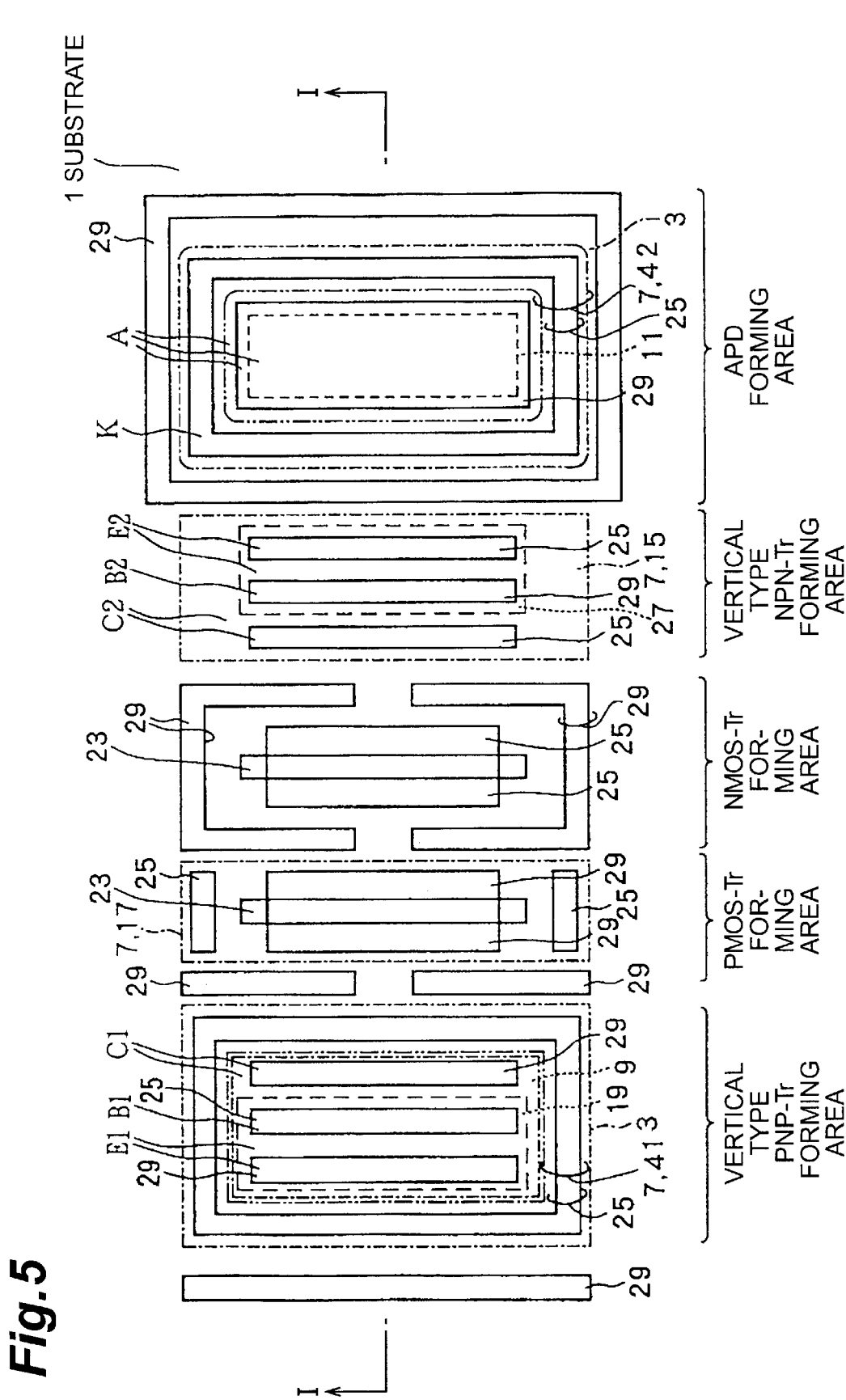
FIG. 5 is a plan view of the BiCMOS-integrated photodetecting semiconductor device corresponding to FIG. 4B.

The planar configuration of the BiCMOS-integrated photodetecting semiconductor device in accordance with the present invention will now be explained below. FIG. 5 is a plan view of the BiCMOS-integrated photodetecting semiconductor device manufactured by the above-mentioned method, whereas FIG. 4B is a sectional view taken along the plane I—I of FIG. 5. For simplicity, the metal electrode 33 and the light-shielding film 37 are not shown in FIG. 5. FIG. 5 shows the arrangement of the vertical type PNP-Tr forming area, PMOS-Tr forming area, NMOS-Tr forming area, vertical type NPN-Tr forming area, and APD forming area successively from the left to right on the substrate 1.

In the vertical type PNP-Tr forming area, the following configuration shows a PNP structure: the N-type fourth semiconductor region 19 (i.e. base, B1) is disposed so as to surround the P-type diffusion region 29 (i.e. emitter, E1); and the P-type first buried region 9 and the P-type second semiconductor layer 13 (i.e. collector, C1) are disposed so as to surround the base 19. This PNP structure provides a vertical type PNP-Tr in which the P-type first buried region 9 can decrease the collector resistance and its amplified current flows vertically. Since the emitter junction and the base impurity profile of the PNP transistor can be adjusted separately from other elements, the PNP transistor can attain higher performance in Early voltage and frequency characteristics. Furthermore, the collector separation area comprises the N-type second semiconductor region 7 and the N-type fifth semiconductor area 41 and is shaped in a closed band-like area surrounding the P-type first buried region 9. In the collector separation area, the N-type second semiconductor region 7 is formed in contact with the N-type first buried region 3 and the N-type fifth semiconductor area 41 is formed on the N-type second semiconductor region 7. Thus, the collector separation area can isolate the P-type first buried region 9, the P-type first semiconductor layer 5 and the P-type semiconductor layer 13 from others. This isolation allows the application of a desired potential to the collector. Preferably, in order to reduce the collector resistance, the region 29 of the collector (referred as C1) is formed so as to surround the base (referred as B1).

In the PMOS-Tr forming area, the N-type regions 25 are also disposed within the N-type second semiconductor region 17 such that the potential in the substrate-biased portion is stabilized. When a number of regions 25 are formed in this substrate-biased portion, the potential is uniform in the substrate-biased portion. The source and drain are constituted by the P-type fourth semiconductor regions 29 formed in two portions into which the gate electrode 23 divides the active region. It is preferred to form the self-aligned source and drain 29.

In the NMOS-Tr forming area, the N-type diffusion regions 29 are also disposed within the P-type second semiconductor layer 13 in order to stabilize the potential applied to the substrate-biased portion. When a number of regions 29 are disposed in the substrate-biased portion, the potential is uniform in the substrate-biased portion. The source and drain are constituted by the N-type fourth semiconductor regions 25 formed in two portions into which the gate electrode 23 divides the active region. It is preferred to form the self-aligned source and drain 25.

In the vertical type NPN-Tr forming area, the P-type third semiconductor region 27 (referred as base, B2) is disposed so as to surround the N-type diffusion region 25 (referred as emitter, E2), whereas the N-type first buried region 15 (referred as collector, C2) is disposed so as to surround the base 27, whereby an NPN structure is provided. This NPN structure provides a vertical type NPN-Tr in which the N-type second buried region 7 reduces the collector resistance, whereas amplified current flows vertically. Since the base profile and emitter junction of the NPN-transistor can be adjusted independent of other elements, the NPN-transistor can attain higher performances in Early voltage, frequency characteristics, and the like. Furthermore, since the N-type second buried region 7 and the N-type first semiconductor region 15 are surrounded by the P-type first semiconductor layer 5 and the P-type second semiconductor layer 13, a desired potential can be applied to the collector. Preferably, in order to reduce the collector resistance, the diffusion electrode 25 of the collector (referred as C2) is formed so as to surround the base (referred as B2).

In the APD forming area, a light-absorbing portion is constituted by the P-type first semiconductor layer 5 and the P-type second semiconductor layer 13, whereas the P-type fourth semiconductor region 29 is disposed in the surface of the P-type second semiconductor layer 13 to form an anode contact (referred as A). Since the cathode (referred as K) is constituted by the N-type first buried region 3 disposed on the P-type substrate 1, the cathode is leaded to the wafer surface through a cathode leading area. This cathode leading area is constituted by the N-type second semiconductor region 7 and the N-type sixth semiconductor area 42, the N-type second semiconductor region 7 being formed in contact with the N-type first buried region 3 and the N-type sixth semiconductor area 42 being formed on the N-type second semiconductor region 7. If the cathode leading area is provided in a band-like closed region surrounding the anode (A) electrode 29 or P-type second buried region 11, then the layers 5, 13 can be separated into one serving as a light-absorbing area and the other not serving as a light-absorbing area. Consequently, not only the cathode but also the anode is isolated. Namely, the cathode leading area can also be used as the anode separation area. For stabilizing potentials in areas adjacent to the cathode, it is preferred that the cathode be surrounded by a guard ring area formed of one or more P-type regions 29.

In order to improve the operating speed of the vertical type PNP-Tr, the N-type third semiconductor region 19, which is the base of the vertical type PNP-Tr in FIG. 4B, may be formed in a condition other than that of forming the PMOS-Tr substrate-biased portion. In this case, it is preferred that phosphorus ($P^+$) be used as the impurity, and that its dose be at least $3 \times 10^{13}$ cm$^{-2}$ but not greater than $3 \times 10^{14}$ cm$^{-2}$. If the base is thus formed in the separate manufacturing steps, then characteristics of the vertical type PNP-Tr can be adjusted independently.

Also, the N-type third semiconductor region 19 may be formed in both ion implantation steps for forming the N-type first semiconductor region 15 and for forming the N-type second semiconductor region 17. This lowers $h_{fe}$ and increases the breakdown voltage of the vertical type PNP-Tr lowers as the total dose of these ion implantation steps increases. Such a process can be chosen according to an application.

Furthermore, the N-type third semiconductor region 19 may be formed such that an ion implantation is carried out after heating step for forming the vertical type NPN-Tr and PMOS-Tr and then the ion-implanted impurity is the activated in a heating step for forming the base of the vertical type NPN-Tr. Such a process yields a shallow junction of 0.5 $\mu$m to 1 $\mu$m, whereby a high-speed PNP-Tr with a thin base can be provided.

Figure 6:
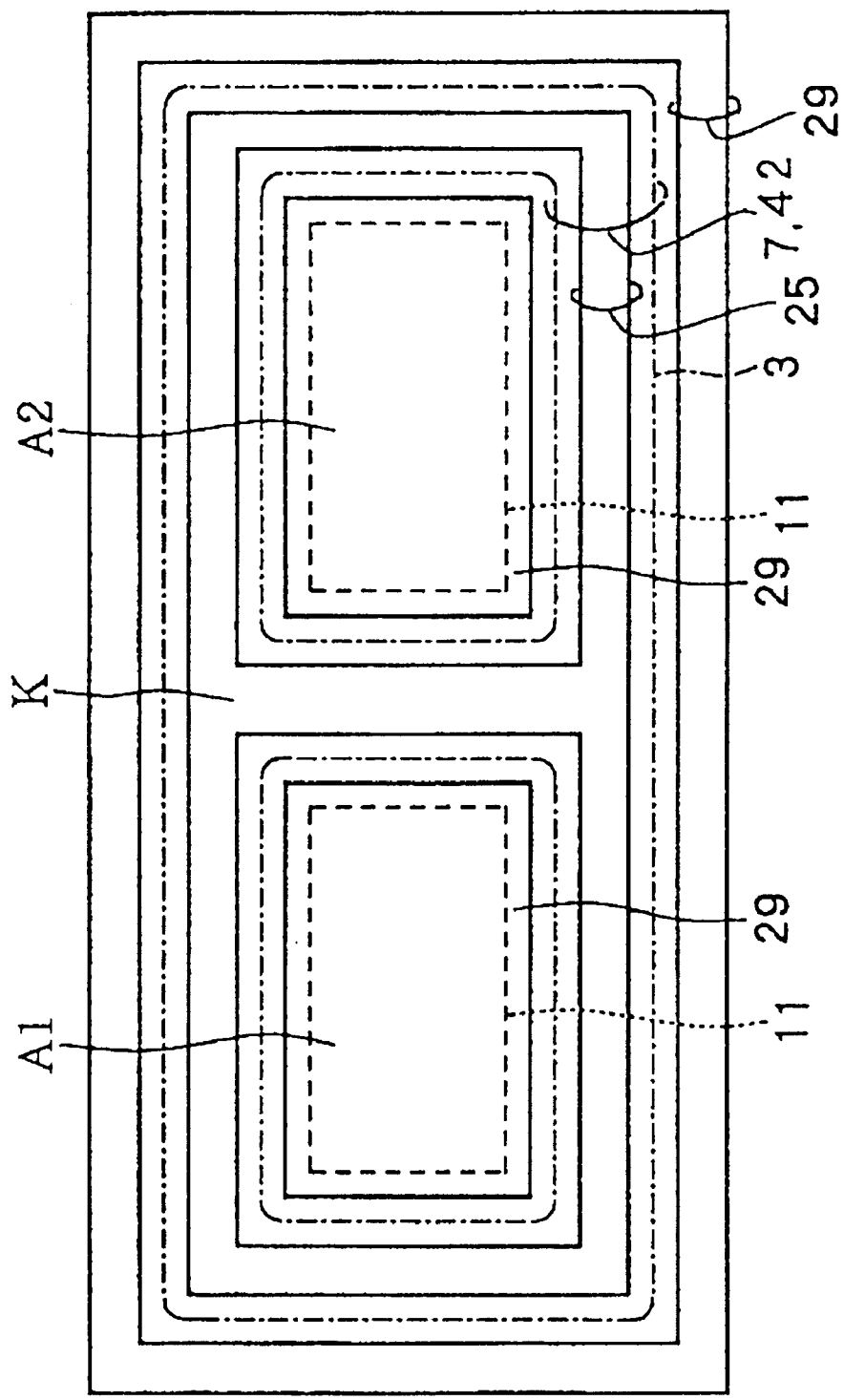
FIG. 6 is a plan view of an APD having another structure.

FIG. 6 is a plan view showing an arrangement of two APDS. If the surface layer of the P-type second semiconductor layer 13 is provided with separate P-type fourth semiconductor regions 29, each of which is surrounded by a cathode leading area, then APDs having a common cathode (referred as K) and separated anodes (referred as A1, A2) can be constructed. If these APDs are connected in parallel with each other, then the combined series resistance of the APDs can be lowered. Also, if signal processing circuits are connected to the plurality of APDs above, respectively, then an arrayed photodetecting semiconductor device can be constructed.

Figure 7:
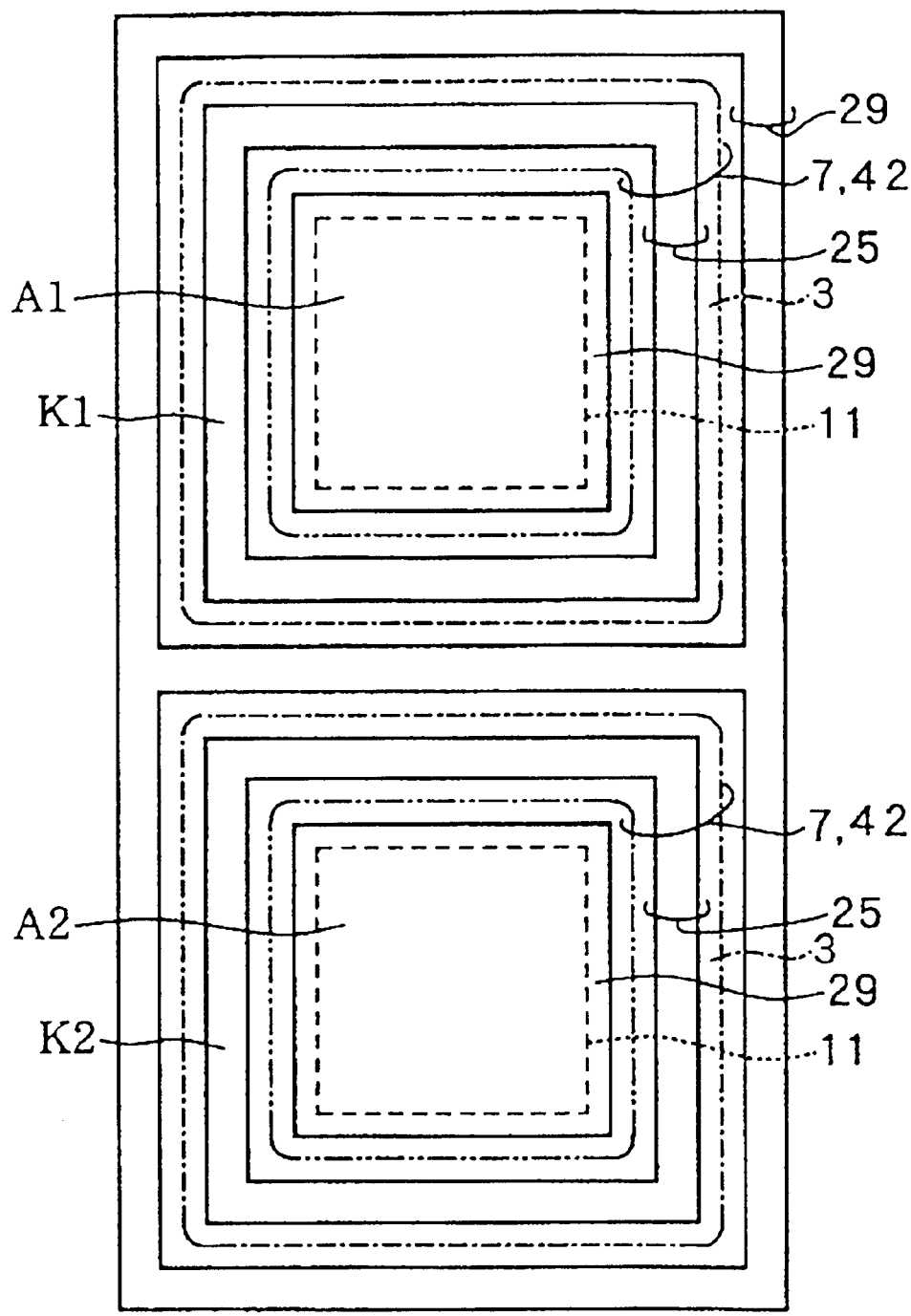
FIG. 7 is a plan view of an APD having another structure.

FIG. 7 is a plan view showing the arrangement of two APDs having independent cathodes. If separate P-type fourth semiconductor regions 29 is provided on the surface of the P-type second semiconductor layer 13, each of which is surrounded by respective cathode leading areas, then APDs having separated cathodes (referred as K1, K2) and separated anodes (referred as A1, A2) can be constructed. If signal processing circuits are connected to the plurality of APDs above, respectively, then an arrayed photodetecting semiconductor device can be obtained. Since these APDs have the respective cathodes, this facilitates the connection of the APDs to the circuits. If the individual APDS are formed such that these P-type second buried regions 11 have their respective impurity concentrations, then the APDs that have characteristics different from each other can be formed on the same substrate 1.

Figure 8A:
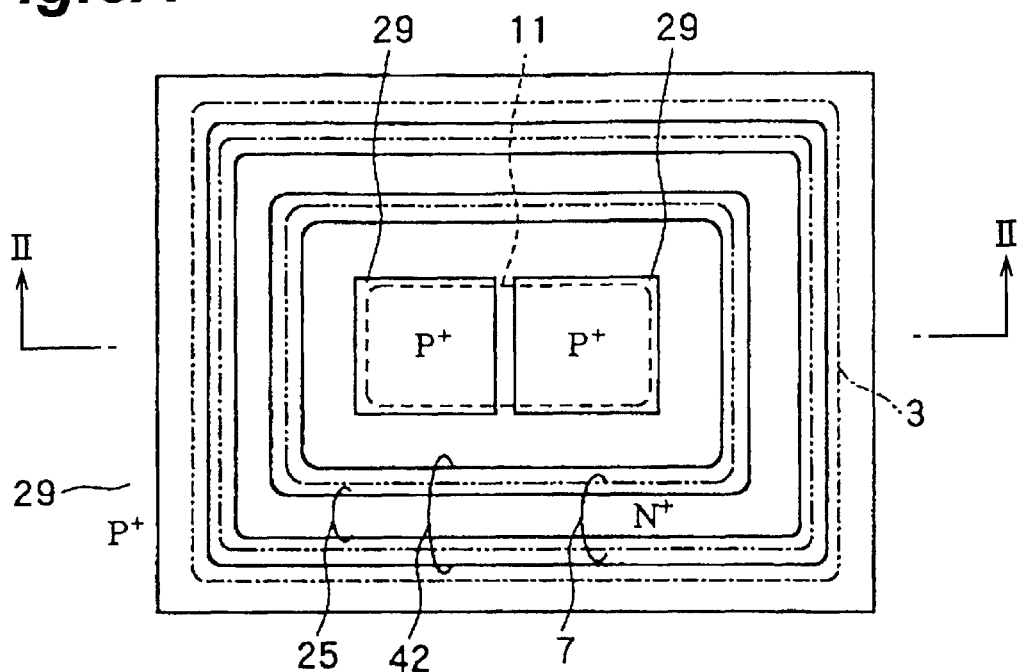
Figure 8B:
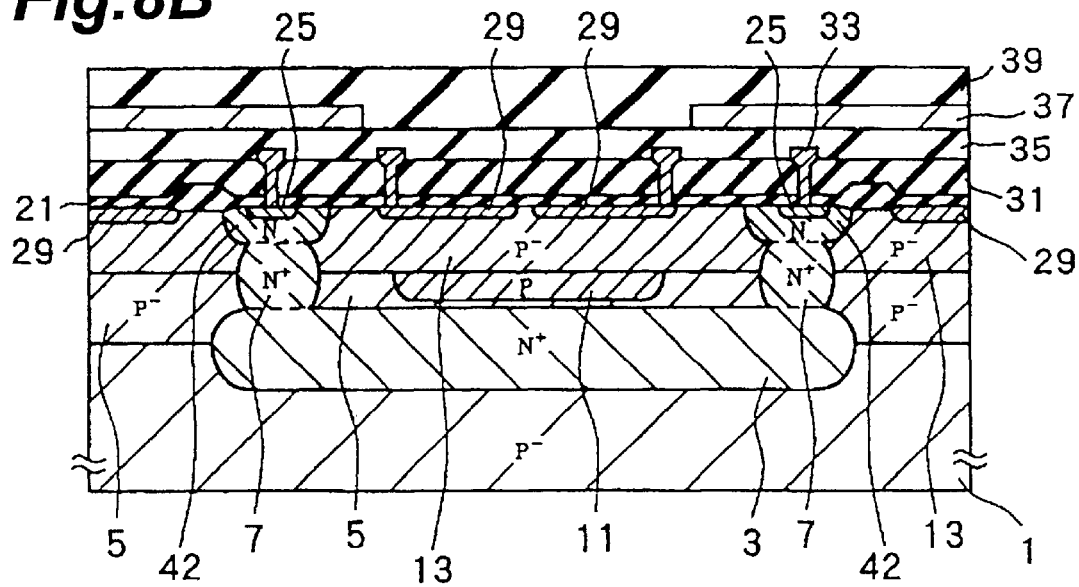
FIG. 8B is a sectional view of this APD taken along plane II—II.

FIG. 8A is a plan view showing the arrangement of two APDs, whereas FIG. 8B is a sectional view thereof taken along the line II—II of FIG. 8A. In FIG. 8A, a single rectangular P-type second buried region 11 is disposed between the P-type first semiconductor layer 5 and the P-type second semiconductor layer 13, whereas two separated rectangular P-type fourth semiconductor regions 29 are disposed, on the buried region 11, in the surface portion of the P-type second semiconductor layer 13. The two P-type fourth semiconductor regions 29 are adjacent to each other. Furthermore, these P-type fourth semiconductor regions 29 are surrounded by a common leading area so as to construct the APDs. In these APDs, if a high voltage is applied between the anode and cathode, so that the P-type semiconductor layers 5, 13 are completely depleted, then the two P-type fourth semiconductor regions 29 are electrically separated from each other by the depletion layer. The APDs operate as they have the common cathode and the two separated anodes. This configuration allows the separated anodes close to each other, so that the APDs becomes small-sized.

As shown in the plan views of FIGS. 5 to 7 and 8A, it is preferable that, in the APDs, the semiconductor portions to which a high voltage is applied have their rounded corners. Such configuration can decrease the strength of electric field caused by the applied voltage in their corners, whereby the breakdown voltage of the APDs can be improved.

Although not explained with reference to drawings, the emitter of the vertical type NPN-Tr may be formed in a manufacturing step different from that of forming the source/drain 25 of the NMOS-Tr. This step can be carried out in the step corresponding to FIG. 3C. For example, this step may include the followings: the oxide film in the emitter portion is removed; a polysilicon film is deposited on the wafer; impurity is introduced into the polysilicon film; the polysilicon film is patterned by use of photolithography technique; and then the impurity is diffused from the polysilicon film to form the emitter. Preferably, the impurity, such as arsenic ($As^{30}$) or phosphorus ($P^+$), is introduced into the polysilicon film in ion implantation method. Since a heavily doped N-type semiconductor region with a shallow junction can thus be formed in the surface portion of the third P-type semiconductor region 27 to form an emitter, a high-performance vertical type NPN-Tr can be constructed.

The emitter of the vertical type PNP-Tr may be formed in a process different from that of forming the source/drain 29 of the PMOS-Tr. Although the detail will not be explained here, this emitter can be formed in a method similar to that of forming the emitter of the vertical type NPN-Tr.

The following explanation relates to an avalanche photodiode (APD), which is a photodetecting semiconductor device, particularly to a segmented-type APD having divided light-receiving areas.

It should be noted that the APD explained hereinafter can solve not only the object of the present invention mentioned above but also an additional object explained in the following. This object is to provide an APD improving its resolution by reducing its separation area that becomes a dead region, and allowing the small-sized APD.

Although the description provided hereinafter relates to a discrete APD as an example, it is also applicable to the invention of the BiCMOS-integrated photodetecting semiconductor device as described above. However, the above-mentioned object can also be attained when applied to a discrete APD. The APD, as described on the basis of the BiCMOS-integrated photodetecting semiconductor device, is applicable to the discrete APD. The description of the APD, as explained with reference to the BiCMOS-integrated photodetecting semiconductor device, can be also applied to an APD as will be described below.

Figure 9:
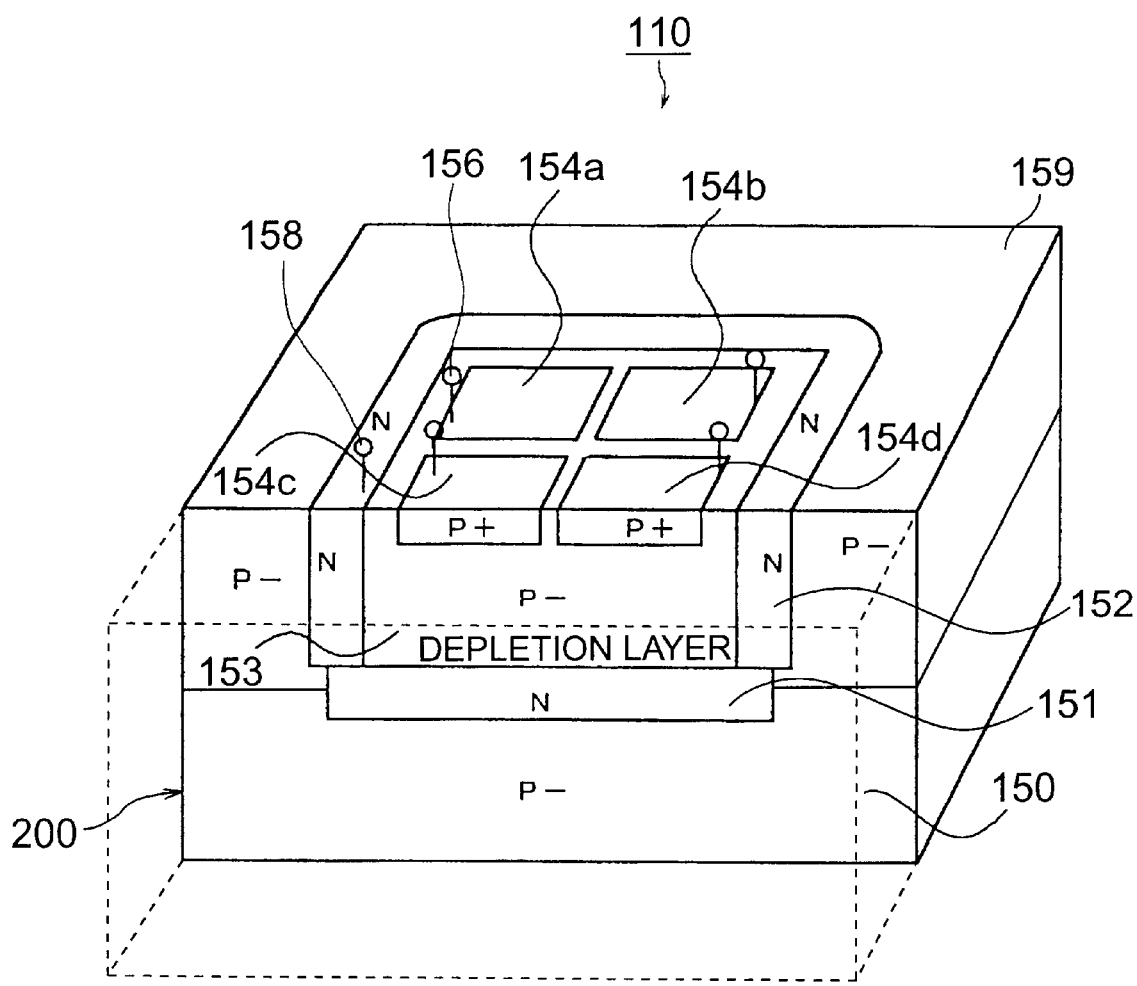
FIG. 9 is a view showing a cross section of the APD in accordance with an embodiment.

The APD capable of attaining the additional object of the present invention will be explained in accordance with an embodiment. FIG. 9 is a view showing a cross section 200 of the APD 110 in accordance with this embodiment. The APD 110 comprises a first P-type region, a second P-type region, and an N-type region. These three regions are disposed on a P-type substrate 150. The first P-type region includes a heavily doped P-type area 154. The second P-type region includes a lightly doped P-type area 153, formed around the heavily doped P-type area 154, with an impurity concentration lower than that of the P-type area 154. The N-type region is formed around the low-concentration P-type area 153. This N-type region is surrounded by the P-type substrate 150 and a P-type area 159.

The heavily doped P-type area 154 is divided into four light-receiving portions 154a to 154d. Each of the light-receiving portions 154a to 154d has a rectangular or square form. Each individual light-receiving portion is disposed so as to be adjacent to two of the remaining light-receiving portions. Namely, in the heavily doped P-type area 154, the light-receiving portions 154a to 154d are arranged in an array of two by two in the longitudinal and lateral directions. The N-type region is constituted by an N-type buried region 151 formed under the lightly-doped P-type area 153 and an N-type diffusion region 152 formed on the side surface of the lightly-doped P-type area 153. 5 Furthermore, each of the light-receiving portions 154a to 154d is provided with an anode electrode 156, whereas the N-type diffusion region 152 is provided with a cathode electrode 158.

The APD 110 comprises a P-type region consisting of a plurality of P-type semiconductor portions; a P-type region, formed so as to surround each of the plurality of P-type semiconductor portions, with an impurity concentration lower than that of the P-type semiconductor region; and an N-type region formed so as to electrically isolate the P-type region.

The materials forming the individual constituents will be described. The P-type substrate 150 is formed from a P-type semiconductor having an impurity concentration of about $1 \times 10^{15}/cm^3$, for example; whereas the N-type buried region 151 and the N-type diffusion layer 152 are formed from N-type semiconductors having impurity concentrations of about $1 \times 10^{19}/cm^3$ and about $1 \times 10^{17}/cm^3$, respectively, for example. The lightly-doped P-type area 153 is formed from a P-type semiconductor having an impurity concentration of about $2 \times 10^{15}/cm^3$, for example; whereas the high-concentration P-type area 154 is a shallow diffusion layer formed from a P-type semiconductor having a surface impurity concentration of about $1 \times 10^{20}/cm^3$, for example.

The lightly-doped P-type area 153 is formed so as to be surrounded by an N-type region comprising the N-type buried layer 151 and N-type diffusion region 152, and is preferably completely depleted when a high voltage is applied to its surrounding N-type region. on the other hand, the lightly-doped P-type area 153 also serves as a photoelectric converting portion of the APD 110, and this area should be formed as a relatively thick layer in order to improve its sensitivity in a long wavelength region. Therefore, in view of a voltage applied to the APD and the strength of electric field caused thereby, the lightly-doped P-type area 153 is formed with its thickness and impurity concentration which are adjusted such that the lightly-doped P-type area 153 can be depleted fully in the application of a high voltage and can attain a sufficient sensitivity. In the APD 110 in accordance with this embodiment, the thickness of the lightly-doped P-type area 153 is about 4 $\mu$m.

The operations of the APD will now be explained in accordance with this embodiment. When a high voltage is applied in a reverse direction between the anode electrode 156 and cathode electrode 158 of the APD 110, avalanche multiplication may occur in the lightly doped P-type area 153. Since the PN junction of the APD 110 is formed between the lightly-doped P-type area 153 and N-type buried layer 151, the junction is depleted in the application of the high voltage, and this depletion area extends into the lower-concentration P-type area 153. The depleted area 153, therefore, electrically separates the individual light-receiving portions 154a to 154d. Consequently, without additional separating means such as a guard ring or anti-inversion region provided in the interstices between the individual light-receiving portions 154a to 154d or in the outer periphery of the heavily-doped P-type area 154, the individual light-receiving portions 154a to 154d operate as four independent segmented APD elements.

Furthermore, the depletion layer is not generated in the interface between the lightly-doped P-type area 153 and the heavily-doped P-type area 154 but is generated in the junction between the lightly-doped P-type area 153 and the N-type buried layer 151. This can decrease the strength of the electric fields at the corners portions of the individual light-receiving portions 154a to 154d forming the high-concentration P-type area 154.

In practice, the incident light generates carriers, electron-hole pairs, in the light-receiving portions 154a to 154d, the depleted P-type area 153 and the N-type region according to the intensity thereof. These generated carriers are accelerated by a high electric field in the depletion layer to cause an avalanche phenomenon, thereby generating a large avalanche current. Hence, weak light is taken out as a large current.

In the APD 110, the carriers, generated through photo-electric conversion, are attracted vertically by the electric field in the depleted lightly-doped P-type area 153 so as to be detected in the anode electrode 156 located just above the light incident position.

The low concentration P-type area 153 is surrounded by the N-type region to be electrically isolated from the P-type substrate 150. This structure allows the formation of signal processing circuit including other elements, such as bipolar NPN transistors, PNP transistors, CMOS, on the P-type substrate 150, thereby making an integrated circuit.

The advantages of the APD in accordance with this embodiment will now be explained. In the APD 110, since a PN junction is formed between the lightly-doped P-type area 153 and the N-type buried region 151, this junction is depleted in the application of a high voltage between the P-type area 153 and the N-type buried region 151. The depletion layer above spreads into the P-type area 153. As a consequence, the individual light-receiving portions 154a to 154d are electrically separated by the depleted P-type area 153, and the strength of electric fields is decreased at the corners of the individual light-receiving portions 154a to 154d. There is no need to provide additional separating means, such as a guard ring or anti-inversion layer, in separation area between the individual light-receiving portions 154a to 154d or in the outer periphery of the P-type area 154. This results in the smaller separation area that is dead region. The reduced separation can improve the resolution, and the APD elements can attain a smaller size.

Specifically, when the thickness of the layer of the high-concentration P-type area 154 including the light-receiving portions 154a to 154d is about 0.3 μm, the individual light-receiving portions 154a to 154d can sufficiently be separated from each other even if the width. of the separation area is about 2 μm.

In the APD 110, due to the electric field in the depleted P-type area 153, the carriers generated in photoelectric conversion are vertically attracted so as to be detected in the anode 156 located directly above the light incident position. The avalanche current can be detected in the light-receiving portions located directly above the incident light. This can reduce their crosstalk and noise in the APDS.

Figure 10:
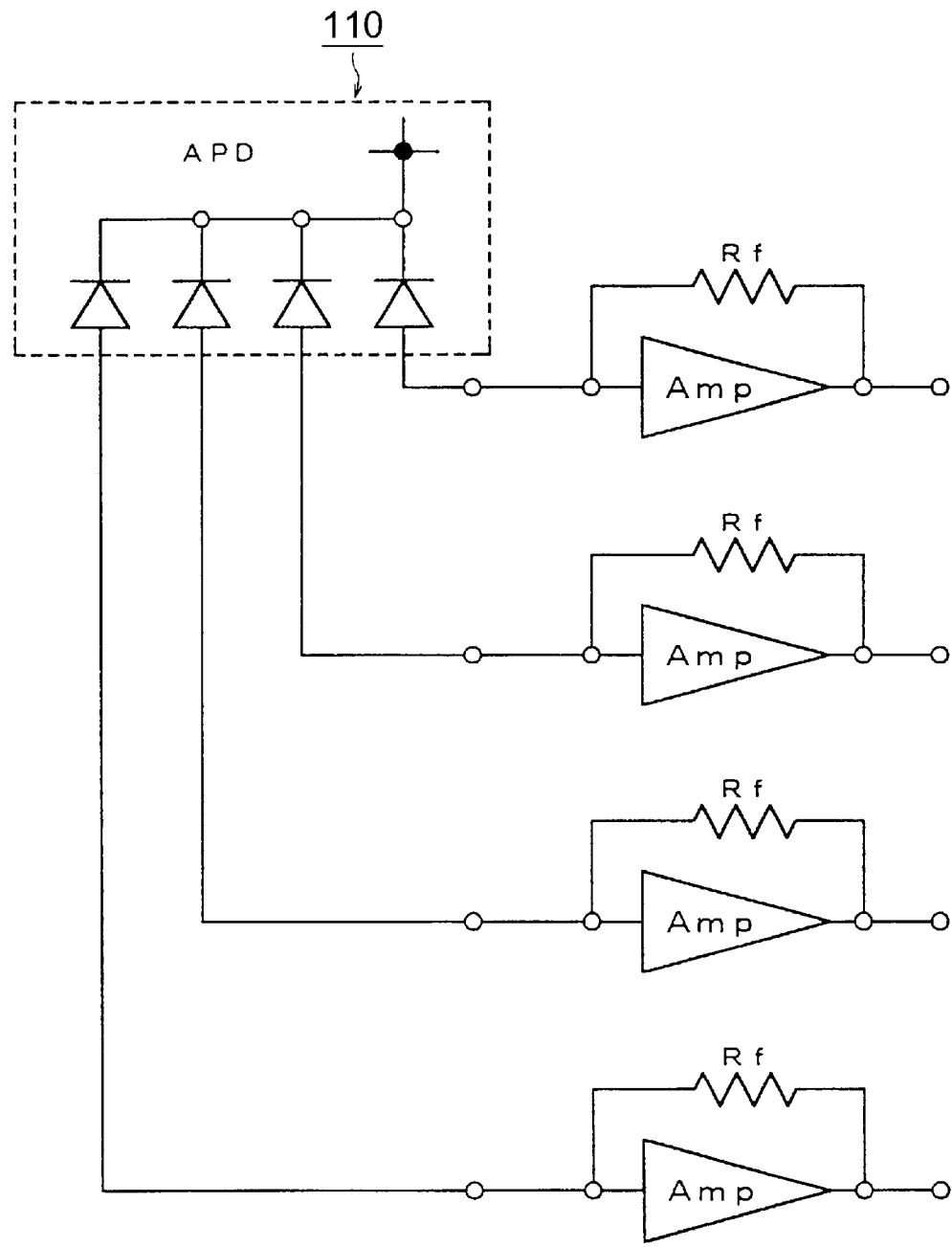
FIG. 10 is a circuit diagram of an integrated circuit including the APD in accordance with an embodiment.

Since the P-type area 154 is divided into four, the light-receiving portions 154a to 154d, the APD 110 can have four light-receiving elements within the same element. This configuration is able to easily improve the resolution without increasing the number of manufacturing steps. FIG. 9 shows an example of integrated circuits constructed by use of the APD 110, which will now be explained with reference to FIG. 10. FIG. 10 shows a circuit diagram of an. integrated circuit with the APD 110.

As shown in FIG. 10, the integrated circuit is configured such that the APD 110 is formed on one chip and four light-receiving portions 154a to 154d is connected to respective amplifiers and resistors. The four light-receiving portions 154a to 154d provide respective signals. The integrated circuit in FIG. 10 can be manufactured monolithically by forming, on the same substrate, four amplifier units and the APD 110 that are connected to each other through metal wires. In FIG. 10, each of the amplifier units comprises an amplifier circuit Amp and a resistor Rf. Each amplifier unit has a bipolar transistor and a resistor on the same substrate.

Figure 11:
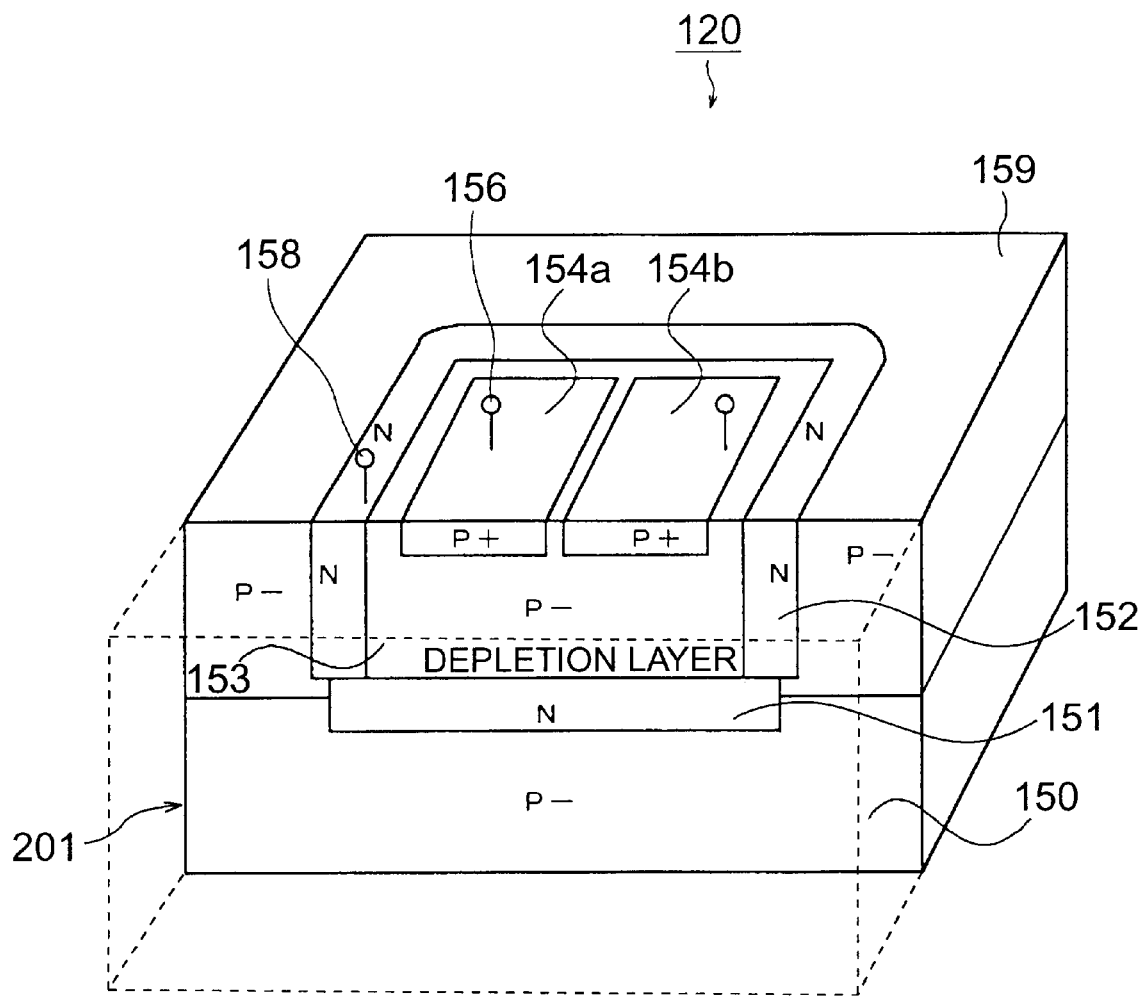
FIG. 11 is a view showing a cross section of the APD in accordance with an embodiment.

The APD in accordance with an embodiment will now be explained below. FIG. 11 is a view showing a cross section 201 of the APD 120 in accordance with the embodiment. The APD 120 in this embodiment is different from the APD 110 in the above-mentioned embodiment in the following points. In the APD 110 in accordance with the above-mentioned embodiment, the heavily-doped P-type area 154 is divided into four sections, the light-receiving portions 154a to 154d, arranged in an array of two by two in the longitudinal and lateral directions. On the other hand, in the APD 120 in accordance with this embodiment, the heavily-doped P-type area 154 is divided into two sections, light-receiving portions 154a, 154b, adjacent to each other.

The operations and effects of the APD 120 are similar to those of the APD 110 in accordance with the first embodiment.

Figure 12A:
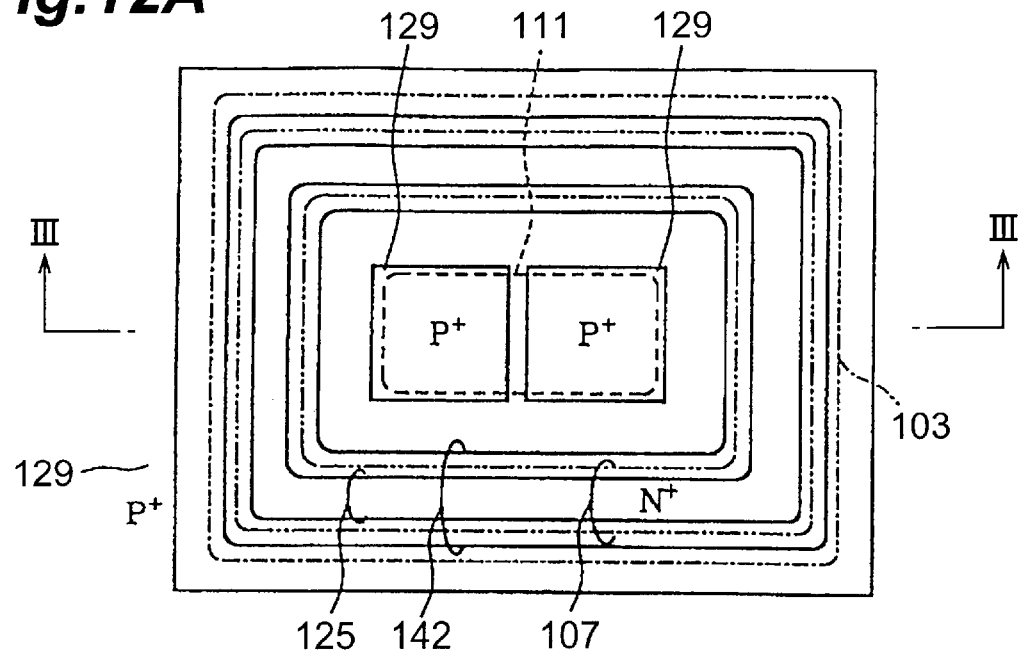
Figure 12B:
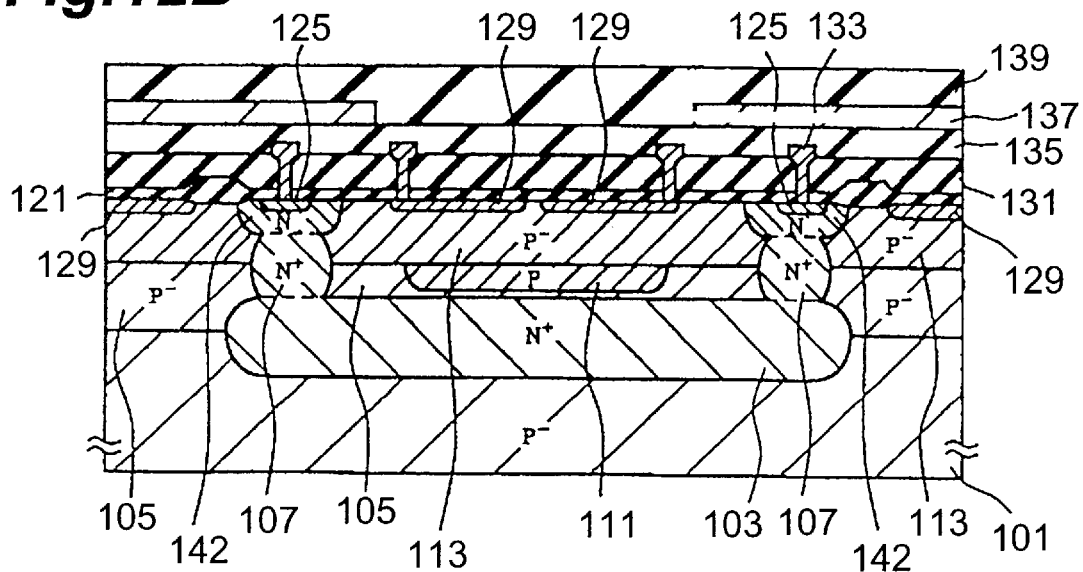
FIG. 12B is a sectional view thereof taken along the plane III—III.

A method of making the APD 110 and APD 120 in accordance with the foregoing embodiments will now be explained, by way of example, with reference to an APD in which the heavily-doped P-type area is divided into two (hereinafter referred to as two-divided APD). FIG. 12A is a plan view of the two-divided APD, whereas FIG. 12B is a sectional view; thereof taken along the plane III—III. As shown in FIGS. 12A and 12B, the two-divided APD is constituted by the following portions: a P-type first semiconductor layer 105 formed on a P-type substrate 101; a P-type second semiconductor layer 113; a single rectangular P-type second buried region 111 formed between the P-type first semiconductor layer 105 and P-type second semiconductor layer 113; a P-type fourth semiconductor region 129 having two separated portions formed in the surface layer of the P-type second semiconductor layer 113; an N-type first buried region 103 formed so as to surround these P-type areas; and an N-type second buried region 107 acting as a cathode leading area.

As can be seen from FIG. 12A, the only P-type fourth semiconductor region 129, acting as light-receiving portions in the surface portion, is divided; whereas the structure of the remaining underlying layers is common to all the four light-receiving elements. The fourth semiconductor region 129 is divided into two portions spaced apart from each other with a narrow width on the order of several micrometers. As mentioned above, the divided elements are fully separated from each other due to the depletion region.

Also, since the PN junction is distanced from the surface portion, there is no occurrence of edge breakdown phenomenon due to the concentration of electric field on the surface portion, whereby no guard ring is provided at the outer periphery of the light-receiving portion.

When explained in conjunction with FIG. 11, the correspondence between FIG. 11 and FIG. 12 is as follows. The N-type buried region 151 in FIG. 11 corresponds to the N-type first buried region 103 in FIG. 12. The N-type diffusion region 152 in FIG. 11 corresponds to the N-type second buried region 107, N-type fourth semiconductor region 125, and N-type sixth semiconductor area 142 in FIG. 12. The low-concentration P-type area 153 in FIG. 11 corresponds to the P-type first semiconductor layer 105, P-type second semiconductor layer 113, and P-type second buried region 111 in FIG. 12. The light-receiving portions 154a and 154b in FIG. 11 correspond to the two P-type fourth semiconductor region 129 in FIG. 12.

The low-concentration P-type second buried region 111, disposed between the P-type first semiconductor layer 105 and the P-type second semiconductor layer 113, is formed so as to control the characteristics of the APD.

Specifically, the P-type second buried region 111 is disposed so as to face with the N-type first buried region 103. The use of the P-type second buried region 111 allows the adjustment of the avalanche breakdown voltage by controlling the depletion layer width spreading from the N-type first buried region 103 according to its impurity profile.

For manufacturing the two-divided APD, a silicon oxide film is initially formed on the P-type Silicon substrate 101 and then is patterned. By using the patterned silicon oxide film as a mask, N-type impurity is thermally diffused to form the N-type first buried region 103. The P-type first semiconductor layer 105 is formed thereon by epitaxial growth. Then, the N-type first buried region 107 is formed in thermal diffusion method and the P-type second buried region 111 is formed in ion implantation method. On the N-type first buried region 107 and the P-type second buried layer 111, the P-type second semiconductor region 113 is further formed in epitaxial growth method.

Then, an N-type sixth semiconductor area 142 is formed in thermal diffusion method. In this thermal diffusion, the N-type first buried region 103, the N-type second buried region 107, and the N-type sixth semiconductor area 142 are overlapped to be electrically connected to each other because the impurity thereof diffuses.

As shown in FIG. 12B, these N-type regions surround a P-type region to form the N-type separation area in a band-like shape closed along the outer periphery of the N-type first buried region 103.

Then, two-divided rectangular portions are formed on the P-type second semiconductor layer 113 with a photoresist mask. Through the mask, P-type impurity is implanted heavily in ion implantation method to form a shallow junction, whereby two portions of P-type fourth semiconductor region. 129 are formed as a light-receiving portion (referred as anode).

Subsequently, a BPSG film 131, metal electrodes 133, and an interlayer insulating film 135 are formed, a light-shielding film 137 is formed in the area of the wafer surface other than the light-receiving area, and a passivation film is formed thereon. Then, the two-divided APD in FIGS. 12A and 12B is completed.

The description above has explained the APD in which the P-type fourth semiconductor region 129 has two rectangular or square light-receiving portions. If resist, acting as a mask for forming the P-type fourth semiconductor region 129 in ion implantation, is formed in a desirable number of segments and a desirable shape for APDs, then the anode can be formed with a given number of segments and a given shape. No additional manufacturing step is needed therefor.

The avalanche photodiode in accordance with the above-mentioned embodiment employs the P-type substrate 150. If no integrated circuit is formed monolithically on the same substrate, an N-type substrate can be also used. In this case, a cathode electrode of this APD may be disposed on the bottom surface of the substrate.

This APD has the following effects. The APD comprises: the first P-type region; the second P-type region, formed so as to surround the first P-type region, having an impurity concentration lower than that of the first P-type region; and the N-type region formed so as to surround the second P-type region, whereby the second P-type region is depleted in the application of a high voltage. This results in the divided individual portions of the first P-type region being electrically isolated from each other and the strength of electric field in the edge portions of the first P-type region being reduced. Hence, there is no need to provide interstices between the divided individual portions of the first P-type region, a guard ring at the outer periphery of the first P-type region, or additional separating means such as anti-inversion layer.

This allows the reduction of the interstices above and interstices between APD elements, so that the separation area, which is an insensitive region for light, is reduced. This results in the improved resolution and smaller size of the APD.

The APD having the above effects will be explained as compared with the prior art. In a conventional APD, carriers photoelectrically generated in a light-receiving portion enter a PN junction region under a high reverse electric field. These carriers are accelerated by the electric field to collide with neutral atoms in the semiconductor material, thereby generating further carriers. Furthermore, thus generated carriers collide with other atoms therein, thereby generating new carriers. Thus occurring is an avalanche phenomenon in which these carriers are similarly generated in succession, so that the number of the carriers will increase exponentially. Signal current arising from weak light signal can be amplified.

On the other hand, recently, a segment-type APD has been devised. The segment-type APD comprises a plurality of light-receiving portions within one element region. Each of the divided light-receiving portions, acting as a light-receiving element, can detect light, so that weak light is detected in the improved positional resolution. The APD can improve a distance measuring device and so on.

In the conventional APD, however, edge breakdown phenomenon is likely to occur on end portions (edges) of PN junctions due to higher electric field than that on other portions thereof. When the edge breakdown occurs, the avalanche phenomenon is inhibited in their light-receiving portions. In order to prevent the occurrence of the edge breakdown, peripheral portions around PN junctions have, therefore, been provided with guard rings.

Also, anti-inversion layers for isolating APD elements have been provided between the APD elements and between one light-receiving portion and another light-receiving portion adjacent thereto in a segment-type APD. Although the guard rings and anti-inversion layers work as photoelectric converting portions, they function as insensitive, dead, regions where the avalanche multiplication does not occur. As the element separating portions or the separation areas in the divided light-receiving portions have a broader width, the resolution of the APD becomes lower.

Hence, there has been devised a segment APD without the guard ring between light-receiving portions adjacent to each other, so that the width of the insensitive regions is reduced. This improves the resolution of the APD (see Japanese Patent Application Laid-Open No. 07-226532).

Figure 13A:
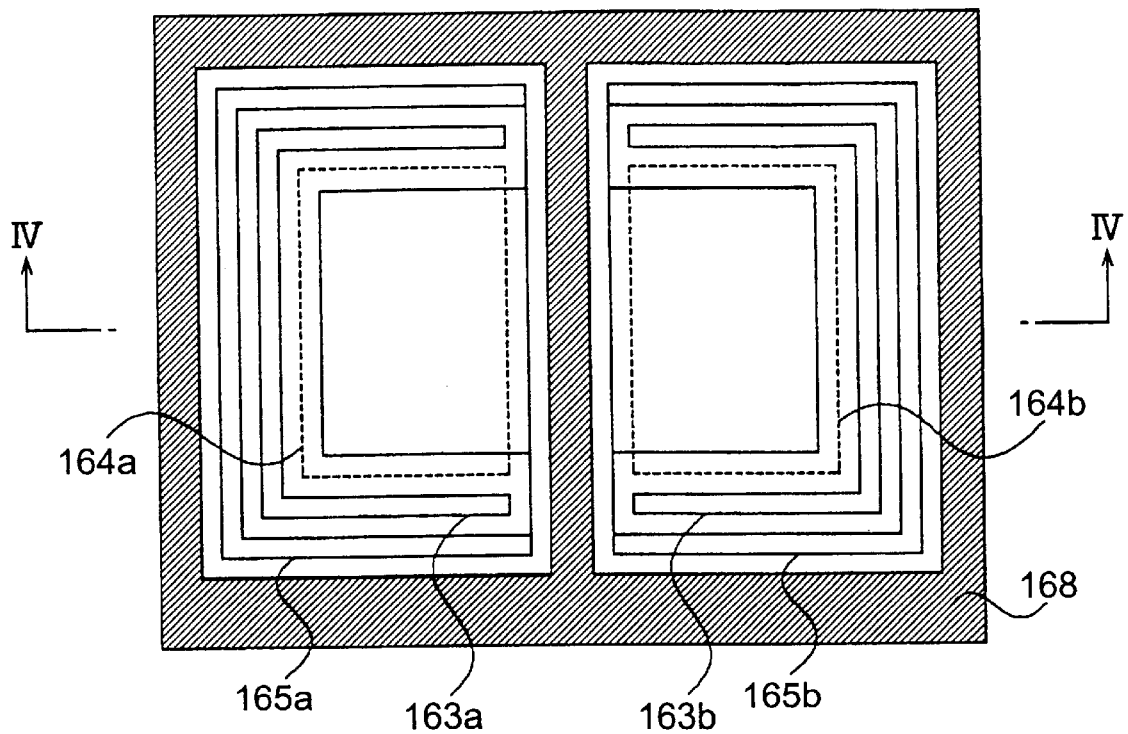

Here, a conventional segment APD will be explained below. FIG. 13A is a plan view showing the configuration of a conventional APD, whereas FIG. 13B is a sectional view thereof taken along the IV—IV plane.

Figure 13B:
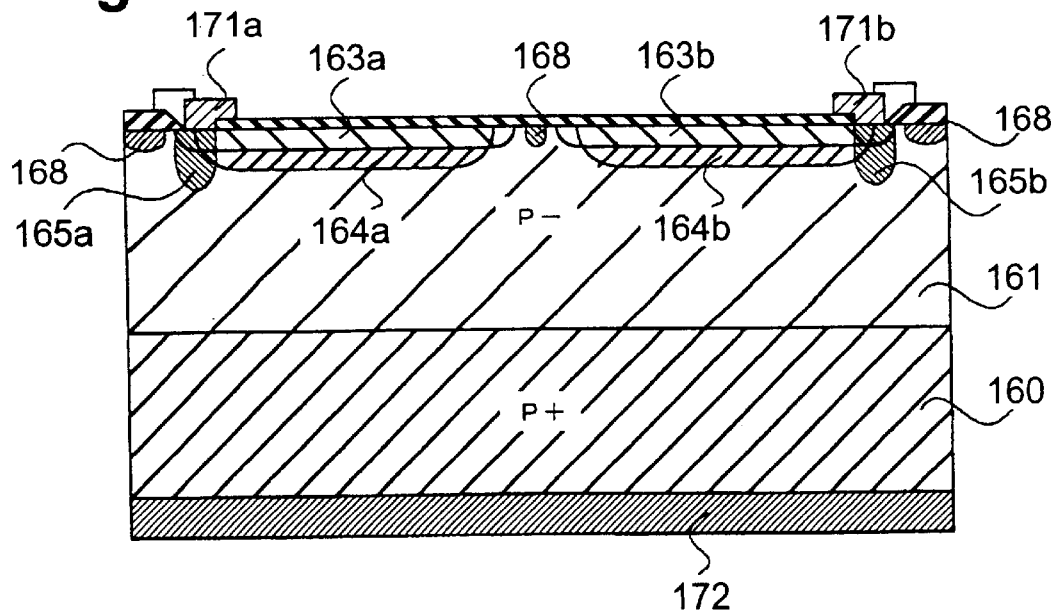
FIG. 13B is a sectional view thereof taken along the line IV—IV.

As shown in FIG. 13B, the conventional APD comprises: an epitaxial P layer 161 formed on a P-type substrate 160; guard rings 165a and 165b of N-type diffusion layers formed thereon; P-type layers 164a and 164b provided such that high electric field can be generated; and high-concentration N-type layers (N+ layers) 163a, 163b.

As shown in FIG. 13A, the high-concentration N-type layers (N+ layers) 163a, 163b are similar to light-receiving portions and are connected to cathode electrodes 171a, 171b. The bottom surface of the substrate is also provided with an anode electrode 172.

In this conventional segment APD, a depletion layer spreads between the adjacent light-receiving portions, so that the concentration of electric fields is alleviated, whereby the occurrence of the edge breakdown is prevented. Consequently, there is no need for a guard ring in an area for isolating the high-concentration N-type layers (N+ layers) 163a, 163b.

An N-type guard rings 165a and 165b is, however, disposed in the outer peripheral edge portions of the high-concentration N-type layers (N+ layers) 163a, 163b, and also an anti-inversion layer 168 is disposed in the separation area and around the peripheral parts of the light-receiving portions.

Although no guard ring is provided between the adjacent light-receiving portions as such, the guard rings are provided along the peripheral parts of the light-receiving portions. The anti-inversion layer is also disposed between the divided elements and between the elements. The above-mentioned conventional segment APD has been problematic in that the dead regions of the ADP are not sufficiently reduced, which inhibits the smaller size and the improved resolution of the conventional APD. Also, in order to prevent electric field concentration on the separation region of the above-mentioned conventional APD, the large width of the separation area is needed between the adjacent divided elements because the maximum electric field strength occurs in the PN junction appearing at the surface of the APD. Consequently, it has been a problem in that the dead region of the APD becomes so large that the resolution cannot be improved.

This problem is overcome by providing an APD in which a separation area acting as a dead region is reduced to improve the resolution thereof. As explained in the embodiments, the APD of the present invention can overcome this problem as explained above.

Having been explained in detail in the foregoing, the present invention can provide a BiCMOS-integrated photodetecting semiconductor device in which an APD is integrated on the same P-type substrate, wherein the anode and cathode thereof are separated from each other and the APD has a high sensitivity in a range from near infrared region to visible region.

The present invention can, also, provide a BiCMOS-integrated photodetecting semiconductor device in which a vertical type PNP-Tr and a vertical type NPN-Tr are integrated on the same P-type substrate. In the device, the vertical type PNP-Tr has a collector separated from the substrate and exhibits a large supplying current, small Early Effect and collector resistance, and improved frequency characteristics. In the device, the vertical type NPN-Tr also has a collector separated from the substrate.

Consequently, since a complementary circuit technique can be utilized in the signal processing circuits for the respective APDs, the amplifying circuits can realize gain increase and higher operation speed and the power source voltage dependence of circuit operations can be reduced.

Also, if the APD is associated with the signal processing circuit therefor and the APDs associated with the circuits are arranged in an array, it is possible to process high-speed signal from the arrayed APDs.

By use of the BiCMOS circuit, a temperature-compensated APD can also be realized. Namely, utilizing this photodetecting semiconductor device can provide a semiconductor device and an optical converting element. The optical converting element, integrated with an amplifier, is provided for converting optical signal into electric signal in optical instruments, optical systems, optical communications and the like. The semiconductor device can process the electric signal in an analog/digital circuit.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A BiCMOS-integrated photodetecting semiconductor device formed on a P-type semiconductor substrate, wherein said P-type semiconductor substrate has, on a main surface thereof, an avalanche photodiode forming area, a vertical type PNP transistor forming area, an N-channel MOS transistor forming area for an N-channel MOS transistor, a P-channel MOS transistor forming area for a P-channel MOS transistor, and a vertical type NPN transistor forming area; said BiCMOS-integrated photodetecting semiconductor device comprising:

N-type first buried regions formed in said avalanche photodiode forming area and vertical type PNP transistor forming area;

a P-type first semiconductor layer formed on said P-type semiconductor substrate and N-type first buried regions in said avalanche photodiode forming area, vertical type PNP transistor forming area, N-channel MOS transistor forming area, P-channel MOS transistor forming area, and vertical type NPN transistor forming area;

N-type second buried regions formed in said P-type first semiconductor layer in said P-channel MOS transistor forming area and vertical type NPN transistor forming area;

a P-type first buried region formed, in said P-type first semiconductor layer, on said N-type first buried region in said vertical type PNP transistor forming area;

a P-type second buried region formed, in said P-type first semiconductor layer, on said N-type first buried layer in said avalanche photodiode forming area;

a P-type second semiconductor layer formed on said P-type first semiconductor layer, P-type first buried region, P-type second buried region, and N-type second buried regions;

an N-type first semiconductor region formed in contact with said N-type second buried region in said vertical type NPN transistor forming area;

an N-type second semiconductor region formed in contact with said N-type second buried region in said P-channel MOS transistor forming area;

an N-type third semiconductor region formed on said P-type first buried region in said vertical type PNP transistor forming area;

an N-type fourth semiconductor region formed in said N-type first semiconductor region in said vertical type NPN transistor forming area;

a P-type third semiconductor region formed, so as to surround said N-type fourth semiconductor region, in said N-type first semiconductor region in said vertical type NPN transistor forming area; and a P-type fourth semiconductor region formed in said N-type third semiconductor region in said vertical type PNP transistor forming area;

wherein a vertical type PNP transistor is constituted as follows: a collector including said P-type first buried region; P-type first semiconductor region, and P-type second semiconductor layer in said vertical type PNP transistor forming area, a base including said N-type third semiconductor region; and an emitter including said P-type fourth semiconductor region;

wherein a vertical type NPN transistor is constituted as follows: a collector including said N-type second buried region and N-type first semiconductor region in said vertical type NPN transistor forming area; a base including said P-type third semiconductor region; and an emitter including said N-type fourth semiconductor region;

wherein an avalanche photodiode is constituted as follows: an anode including said P-type first semiconductor layer and P-type second semiconductor layer in said avalanche photodiode forming area; and a cathode including said N-type first buried region in said avalanche photodiode forming area;

wherein the collector of said vertical type PNP transistor is separated by said N-type second buried region formed, in contact with said N-type first buried region in said vertical type PNP transistor forming area, so as to surround said P-type first buried region, and an N-type fifth semiconductor region formed in contact with said N-type second buried region; and wherein said anode is separated by said N-type second buried region formed, in contact with said N-type first buried region in said avalanche photodiode forming area, so as to surround said P-type second buried region, and an N-type sixth semiconductor region formed in contact with said N-type second buried region.

2. The BiCMOS-integrated photodetecting semiconductor device according to claim 1, wherein said N-type third semiconductor region, which is the base of said vertical type PNP transistor, is formed in the same manufacturing step as said N-type second semiconductor region.

3. The BiCMOS-integrated photodetecting semiconductor device according to claim 1, further comprising a light-shielding film on said vertical type PNP transistor, said vertical type NPN transistor, said N-channel MOS transistor, and said P-channel MOS transistor, said light-shielding film comprising an opening portion disposed on the anode of said avalanche photodiode.

4. The BiCMOS-integrated photodetecting semiconductor device according to claim 1, wherein said N-type fifth semiconductor region and sixth semiconductor region are formed by the same manufacturing step as at least one of said N-type first semiconductor region and said N-type second semiconductor region.

5. The BiCMOS-integrated photodetecting semiconductor device according to claim 1, wherein said avalanche photodiode has said P-type fourth semiconductor region formed in said anode, said fourth semiconductor region including a plurality of P-type semiconductor portions separated from each other.

6. The BiCMOS-integrated photodetecting semiconductor device according to claim 5, wherein said plurality of P-type semiconductor portions are arranged in rows and columns.

* * * * *